United States Patent
Ding et al.

(10) Patent No.: US 10,008,628 B2
(45) Date of Patent: *Jun. 26, 2018

(54) THIN-FILM SEMICONDUCTOR OPTOELECTRONIC DEVICE WITH TEXTURED FRONT AND/OR BACK SURFACE PREPARED FROM TEMPLATE LAYER AND ETCHING

(71) Applicant: Alta Devices, Inc., Sunnyvale, CA (US)

(72) Inventors: I-Kang Ding, Mountain View, CA (US); Brendan M. Kayes, Los Gatos, CA (US); Rose Twist, San Jose, CA (US); Sylvia Spruytte, Palo Alto, CA (US); Feng Liu, San Jose, CA (US); Gregg Higashi, San Jose, CA (US); Melissa J. Archer, San Jose, CA (US); Gang He, Cupertino, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/340,560

(22) Filed: Nov. 1, 2016

(65) Prior Publication Data

US 2017/0047471 A1    Feb. 16, 2017

Related U.S. Application Data

(63) Continuation of application No. 14/452,393, filed on Aug. 5, 2014, now Pat. No. 9,502,594, which is a
(Continued)

(51) Int. Cl.
*H01L 31/18* (2006.01)
*H01L 31/0236* (2006.01)
(Continued)

(52) U.S. Cl.
CPC ...... *H01L 31/184* (2013.01); *H01L 31/02168* (2013.01); *H01L 31/02363* (2013.01);
(Continued)

(58) Field of Classification Search
None
See application file for complete search history.

(56) References Cited

U.S. PATENT DOCUMENTS 3,615,853 A   10/1971  Paine et al.
3,838,359 A    9/1974  Hakki et al.
(Continued)

FOREIGN PATENT DOCUMENTS

CN      1574388 A    2/2005
CN    102007582 A    4/2011
(Continued)

OTHER PUBLICATIONS

Chinese Office Action issued in Chinese Patent Application No. 201510475349.5 dated Nov. 30, 2016.
(Continued)

*Primary Examiner* — Evren Seven
(74) *Attorney, Agent, or Firm* — Arent Fox LLP

(57) ABSTRACT

A method for providing a textured layer in an optoelectronic device is disclosed. The method includes depositing a template layer on a first layer. The template layer has significant inhomogeneity either in thickness or in composition, or both, including the possibility of forming one or more islands to provide at least one textured surface of the island layer. The method also includes exposing the template layer and the first layer to an etching process to create or alter at least one textured surface. The altered at least one textured surface is operative to cause scattering of light.

30 Claims, 15 Drawing Sheets

Related U.S. Application Data continuation-in-part of application No. 13/354,175, filed on Jan. 19, 2012, now Pat. No. 9,136,422.

(51) Int. Cl.
*H01L 31/0224* (2006.01)
*H01L 31/056* (2014.01)
*H01L 31/0216* (2014.01)

(52) U.S. Cl.
CPC .......... *H01L 31/02366* (2013.01); *H01L 31/022466* (2013.01); *H01L 31/056* (2014.12); *H01L 31/18* (2013.01); *H01L 31/1884* (2013.01); *Y02E 10/50* (2013.01); *Y02E 10/52* (2013.01); *Y02P 70/521* (2015.11)

(56) References Cited

U.S. PATENT DOCUMENTS

| | | |
|---|---|---|
| 3,990,101 A | 11/1976 | Ettenberg et al. |
| 4,015,280 A | 3/1977 | Matsushita et al. |
| 4,017,332 A | 4/1977 | James |
| 4,094,704 A | 6/1978 | Milnes et al. |
| 4,107,723 A | 8/1978 | Kamath |
| 4,191,593 A | 3/1980 | Cacheux |
| 4,197,141 A | 4/1980 | Bozler et al. |
| 4,295,002 A | 10/1981 | Chappell et al. |
| 4,338,480 A | 7/1982 | Antypas et al. |
| 4,385,198 A | 5/1983 | Rahilly |
| 4,400,221 A | 8/1983 | Rahilly |
| 4,410,758 A | 10/1983 | Grolitzer |
| 4,419,533 A | 12/1983 | Czubatyj et al. |
| 4,444,992 A | 4/1984 | Cox, III |
| 4,479,027 A | 10/1984 | Todorof |
| 4,497,974 A | 2/1985 | Deckman et al. |
| 4,543,441 A | 9/1985 | Kumada et al. |
| 4,571,448 A | 2/1986 | Barnett |
| 4,582,952 A | 4/1986 | McNeely et al. |
| 4,633,030 A | 12/1986 | Cook |
| 4,667,059 A | 5/1987 | Olson |
| 4,773,945 A | 9/1988 | Woolf et al. |
| 4,775,639 A | 10/1988 | Yoshida |
| 4,889,656 A | 12/1989 | Flynn et al. |
| 4,916,503 A | 4/1990 | Uematsu et al. |
| 4,989,059 A | 1/1991 | Micheels et al. |
| 4,997,491 A | 3/1991 | Hokuyo et al. |
| 5,101,260 A | 3/1992 | Nath et al. |
| 5,103,268 A | 4/1992 | Yin et al. |
| 5,116,427 A | 5/1992 | Fan et al. |
| 5,136,351 A | 8/1992 | Inoue et al. |
| 5,217,539 A | 6/1993 | Fraas et al. |
| 5,223,043 A | 6/1993 | Olson et al. |
| 5,230,746 A | 7/1993 | Wiedeman et al. |
| 5,231,931 A | 8/1993 | Sauvageot et al. |
| 5,316,593 A | 5/1994 | Olson et al. |
| 5,330,585 A | 7/1994 | Chang et al. |
| 5,342,453 A | 8/1994 | Olson |
| 5,356,488 A | 10/1994 | Hezel |
| 5,376,185 A | 12/1994 | Wanlass |
| 5,385,960 A | 1/1995 | Emmons et al. |
| 5,465,009 A | 11/1995 | Drabik et al. |
| 5,468,652 A | 11/1995 | Gee |
| 6,107,563 A | 8/2000 | Nakanishi et al. |
| 6,166,218 A | 12/2000 | Ravichandran |
| 6,166,318 A | 12/2000 | Freeouf |
| 6,229,084 B1 | 5/2001 | Katsu |
| 6,231,931 B1 | 5/2001 | Blazey et al. |
| 6,255,580 B1 | 7/2001 | Karam et al. |
| 6,372,981 B1 | 4/2002 | Ueda et al. |
| 6,452,091 B1 | 9/2002 | Nakagawa et al. |
| 6,534,336 B1 | 3/2003 | Iwane et al. |
| 6,617,508 B2 | 9/2003 | Kilmer et al. |
| 7,038,250 B2 | 5/2006 | Sugiyama et al. |
| 7,875,945 B2 | 1/2011 | Krasnov et al. |
| 8,183,081 B2 | 5/2012 | Weidman et al. |
| 8,258,596 B2 | 9/2012 | Nasuno et al. |
| 8,664,515 B2 | 3/2014 | Hong et al. |
| 8,697,553 B2 | 4/2014 | Adibi et al. |
| 8,895,845 B2 | 11/2014 | Kizilyalli et al. |
| 8,895,846 B2 | 11/2014 | Kizilyalli et al. |
| 8,937,244 B2 | 1/2015 | Kizilyalli et al. |
| 8,993,873 B2 | 3/2015 | Youtsey et al. |
| 9,099,595 B2 | 8/2015 | King et al. |
| 9,136,418 B2 | 9/2015 | Nie et al. |
| 9,136,422 B1 | 9/2015 | Higashi et al. |
| 9,178,099 B2 | 11/2015 | Nie et al. |
| 9,502,594 B2 | 11/2016 | Ding et al. |
| 9,537,025 B1 | 1/2017 | Higashi et al. |
| 9,691,921 B2 | 6/2017 | Atwater et al. |
| 9,768,329 B1 | 9/2017 | Kayes et al. |
| 2001/0027805 A1 | 10/2001 | Ho et al. |
| 2002/0000244 A1 | 1/2002 | Zaidi |
| 2002/0053683 A1 | 5/2002 | Hill et al. |
| 2002/0144724 A1 | 10/2002 | Kilmer et al. |
| 2002/0179141 A1 | 12/2002 | Ho et al. |
| 2003/0070707 A1 | 4/2003 | King et al. |
| 2003/0140962 A1 | 7/2003 | Sharps et al. |
| 2003/0222278 A1 | 12/2003 | Liu et al. |
| 2004/0112426 A1 | 6/2004 | Hagino |
| 2004/0166681 A1 | 8/2004 | Iles et al. |
| 2004/0200523 A1 | 10/2004 | King et al. |
| 2005/0022863 A1 | 2/2005 | Agostinelli et al. |
| 2006/0081963 A1 | 4/2006 | Rehder et al. |
| 2006/0090790 A1 | 5/2006 | Kobayashi et al. |
| 2006/0144435 A1 | 7/2006 | Wanlass |
| 2006/0162767 A1 | 7/2006 | Mascarenhas et al. |
| 2006/0207651 A1 | 9/2006 | Posthuma et al. |
| 2006/0255340 A1 | 11/2006 | Manivannan et al. |
| 2007/0131275 A1 | 6/2007 | Kinsey et al. |
| 2007/0137695 A1 | 6/2007 | Fetzer et al. |
| 2007/0137698 A1 | 6/2007 | Wanlass et al. |
| 2007/0151596 A1 | 7/2007 | Nasuno et al. |
| 2007/0166862 A1 | 7/2007 | Kim et al. |
| 2007/0199591 A1 | 8/2007 | Harder et al. |
| 2007/0235074 A1 | 10/2007 | Henley et al. |
| 2007/0277874 A1 | 12/2007 | Dawson-Elli et al. |
| 2008/0128020 A1 | 6/2008 | Zafar et al. |
| 2008/0245409 A1 | 10/2008 | Varghese et al. |
| 2009/0151784 A1 | 6/2009 | Luan et al. |
| 2009/0283802 A1 | 11/2009 | Henderson et al. |
| 2009/0288703 A1 | 11/2009 | Stan et al. |
| 2010/0006143 A1 | 1/2010 | Welser |
| 2010/0015751 A1 | 1/2010 | Weidman et al. |
| 2010/0047959 A1 | 2/2010 | Cornfeld et al. |
| 2010/0055397 A1 | 3/2010 | Kurihara et al. |
| 2010/0065117 A1 | 3/2010 | Kim et al. |
| 2010/0089443 A1 | 4/2010 | Bloomstein et al. |
| 2010/0096010 A1 | 4/2010 | Welser |
| 2010/0126552 A1 | 5/2010 | Kizilyalli et al. |
| 2010/0126570 A1 | 5/2010 | Kizilyalli et al. |
| 2010/0126571 A1 | 5/2010 | Kizilyalli et al. |
| 2010/0126572 A1 | 5/2010 | Kizilyalli et al. |
| 2010/0132744 A1 | 6/2010 | Tadaki et al. |
| 2010/0132774 A1 | 6/2010 | Borden |
| 2010/0132780 A1 | 6/2010 | Kizilyalli et al. |
| 2010/0193002 A1 | 8/2010 | Dimroth et al. |
| 2010/0218819 A1 | 9/2010 | Farmer et al. |
| 2010/0270653 A1 | 10/2010 | Leitz et al. |
| 2010/0294349 A1 | 11/2010 | Srinivasan et al. |
| 2010/0294356 A1 | 11/2010 | Parikh et al. |
| 2010/0300506 A1 | 12/2010 | Heng et al. |
| 2011/0083722 A1 | 4/2011 | Atwater et al. |
| 2011/0088771 A1 | 4/2011 | Lin et al. |
| 2011/0108098 A1 | 5/2011 | Kapur |
| 2011/0156000 A1 | 6/2011 | Cheng |
| 2011/0189817 A1 | 8/2011 | Takahashi et al. |
| 2011/0214728 A1 | 9/2011 | Veerasamy |
| 2011/0244692 A1 | 10/2011 | Jeong et al. |
| 2011/0290322 A1 | 12/2011 | Meguro et al. |
| 2012/0024336 A1 | 2/2012 | Hwang |
| 2012/0031478 A1 | 2/2012 | Boisvert et al. |
| 2012/0055541 A1 | 3/2012 | Granek et al. |
| 2012/0067423 A1 | 3/2012 | Lochtefeld et al. |
| 2012/0104411 A1 | 5/2012 | Iza et al. |

(56) References Cited

U.S. PATENT DOCUMENTS

| | | |
|---|---|---|
| 2012/0125256 A1 | 5/2012 | Kramer et al. |
| 2012/0132930 A1 | 5/2012 | Young et al. |
| 2012/0160296 A1 | 6/2012 | Laparra et al. |
| 2012/0164796 A1 | 6/2012 | Lowenthal et al. |
| 2012/0227805 A1 | 9/2012 | Hermle et al. |
| 2012/0247555 A1 | 10/2012 | Matsushita et al. |
| 2012/0305059 A1 | 12/2012 | Kayes et al. |
| 2013/0025654 A1 | 1/2013 | Bedell et al. |
| 2013/0026481 A1 | 1/2013 | Xu et al. |
| 2013/0112258 A1 | 5/2013 | Park et al. |
| 2013/0153013 A1 | 6/2013 | Archer et al. |
| 2013/0220396 A1 | 8/2013 | Janssen et al. |
| 2013/0270589 A1 | 10/2013 | Kayes et al. |
| 2013/0288418 A1 | 10/2013 | Wang et al. |
| 2013/0337601 A1 | 12/2013 | Kapur et al. |
| 2014/0076386 A1 | 3/2014 | King et al. |
| 2014/0261611 A1 | 9/2014 | King et al. |
| 2014/0312373 A1 | 10/2014 | Donofrio |
| 2015/0171261 A1 | 6/2015 | Domine |
| 2015/0228835 A1 | 8/2015 | Kayes et al. |
| 2015/0368833 A1 | 12/2015 | Farah |
| 2015/0380576 A1 | 12/2015 | Kayes et al. |
| 2016/0155881 A1 | 6/2016 | France et al. |
| 2017/0141256 A1 | 5/2017 | Kayes et al. |
| 2017/0148930 A1 | 5/2017 | Hu et al. |

FOREIGN PATENT DOCUMENTS

| | | |
|---|---|---|
| CN | 102473743 A | 5/2012 |
| CN | 103952768 A | 7/2014 |
| EP | 0595634 | 5/1994 |
| EP | 2927968 A1 | 10/2015 |
| GB | 2501432 A | 10/2013 |
| JP | 63-211775 | 9/1988 |
| JP | 3-285368 | 12/1991 |
| JP | 06-244443 | 9/1994 |
| JP | 07-007148 | 1/1995 |
| JP | 8-130321 | 5/1996 |
| JP | H09213206 A | 8/1997 |
| KR | 10-0762772 | 10/2007 |
| WO | WO 02065553 | 8/2002 |
| WO | WO 2008100603 | 8/2008 |
| WO | 2016123074 A1 | 8/2016 |

OTHER PUBLICATIONS

Aisaka et al. "Enhancement of upconversion Luminescence of Er Doped Al2O3 Films by Ag Islands Films" (Apr. 1, 2008) Applied Physics Letters 92, 132105, pp. 1-3.
B. H. Floyd, et al., "An N—AlGaAs P—GaAs Graded Heterojunction for High Concentration Ratios," pp. 81-86, IEEE, 1987.
Biteen et al. "Spectral Tuning of Plasmon-enhanced Silicon Quantum Dot Luminescence" (Mar. 31, 2006) Applied Physics Letters 88, 131109, pp. 1-3.
Dionne et al. "Highly Confined Photon Transport in Subwavelength Metallic Slot Waveguides" (Jun. 20, 2006) Nano Lett., vol. 6, No. 9, pp. 1928-1932.
Hiroshi Yamaguchi, et al., "Development Status of "Space Solar Sheet"", IEEE PVSC Proceedings, 2008.
Lezec et al. "Negative Refraction at Visible Frequencies" (Apr. 20, 2007) Science, vol. 316, pp. 430-432.
M. M. Sanfacon et al, "Analysis of AlGaAs/GaAs Solar Cell Structures by Optical Reflectance Spectroscopy" IEEE Transactions on Electron Devices, vol. 37, No. 2, Feb. 1990, pp. 450-454.
Nielson et al. "Microfabrication of microsystem-enabled photovoltaic (MEPV) cells." Proceedings of the International Society of Optics and Photonics (SPIE) [online], (Jan. 25, 2011) Retrieved from the internet: <URL: http://photovoltaics.sandia.gov/pubs_2010/2011/Microfab_of_MEPV_Cells_SPIE_2011.pdf> See entire.
Pacifici et al. "Quantitative Determination of Optical Transmission through Subwavelength Slit Arrays in Ag films: The Essential role of Surface Wave Interference and Local Coupling between Adjacent Slits" (Oct. 22, 2007) Thomas J. Watson Lab. of Appl. Phys., pp. 1-4.
Park et al. "Surface Plasmon Enhanced Photoluminescence of Conjugated Polymers" (Apr. 17, 2007) Appl. Phys. Letters 90, 161107, pp. 1-3.
Peter A. Lewis, "Pigment Handbook vol. I: Properties and Economics, 2nd Edition", John Wiley & Sons, New York, pp. 790-791 (1988).
Pillai et al. "Enhanced emission from Si-based Light-emitting Diodes using Surface Plasmons" (Apr. 17, 2006) Applied Physics Letters, 88, 161102, pp. 1-3.
Q. M. Zhang et al., "Effects of Displaced p-n Junction of Heterojunction Bipolar Transistors", IEEE Transactions on Electron Devices, vol. 39, No. 11, Nov. 1992, pp. 2430-2437.
Tanabe et al. "Direct-bonded GaAs/InGaAs Tandem Solar Cell" (Sep. 6, 2006) Appl. Phys. Lett. 89, 102106, pp. 1-3.
Tatsuya Takamoto, et al., "Paper-Thin InGaP/GaAs Solar Cells", IEEE PVSC Proceedings, pp. 1769-1772, 2006.
The Stranski-Krastanov Three Dimensional Island Growth Prediction on Finite Size Model to Othaman et al., 2008.
Van Wijngaarden et al. "Direct Imaging of Propagation and Damping of Near-Resonance Surface Plasmon Polaritons using Cathodoluminescence Spectroscopy" (Jun. 1, 2006) Appl. Phys. Lett. 88, 221111, pp. 1-3.
Volmer-Weber and Stranski-Krastanov InAs . . . As quantum dots emitting at 1.3um by Tsatsul'nikov et al., Journal of Applied Physics, vol. 88, No. 11, Dec. 1, 2000.
Advisory Action dated Apr. 13, 2016 for U.S. Appl. No. 13/446,876 of Kayes, B.M. et al. filed Apr. 13, 2012.
Advisory Action dated Jul. 22, 2011, for U.S. Appl. No. 12/605,108 of Kizilyalli, I.C. et al. filed Nov. 23, 2009.
Corrected Notice of Allowability dated Dec. 9, 2015 for U.S. Appl. No. 14/452,393 of Ding, I.-K. et al. filed Aug. 5, 2014.
Corrected Notice of Allowability dated Jun. 26, 2017 for U.S. Appl. No. 13/705,064 of Kayes, B.M. et al. filed Dec. 4, 2012.
Corrected Notice of Allowability dated May 26, 2017, for U.S. Appl. No. 12/904,047 of Atwater, H. et al. filed Oct. 13, 2010.
Corrected Notice of Allowability dated Apr. 20, 2015 for U.S. Appl. No. 13/451,455 of Nie, H. et al. filed Jul. 19, 2012.
Corrected Notice of Allowability dated Aug. 17, 2015 for U.S. Appl. No. 13/451,455 of Nie, H. et al. filed Jul. 19, 2012.
Corrected Notice of Allowability dated Jun. 29, 2015 for U.S. Appl. No. 13/451,455 of Nie, H. et al. filed Jul. 19, 2012.
Ex Parte Quayle Action dated Nov. 18, 2016 for U.S. Appl. No. 13/705,064 of Kayes, B.M. et al. filed Dec. 4, 2012.
Final Office Action dated Apr. 10, 2014 for U.S. Appl. No. 13/772,043 of Archer, M.J. et al. filed Feb. 20, 2013.
Final Office Action dated Apr. 20, 2017 for U.S. Appl. No. 13/446,876 of Kayes, B.M. et al. filed Apr. 13, 2012.
Final Office Action dated Apr. 26, 2012 for U.S. Appl. No. 12/605,108 of Kizilyalli, I.C. et al. filed Nov. 23, 2009.
Final Office Action dated Apr. 28, 2011 for U.S. Appl. No. 12/605,108 of Kizilyalli, I.C. et al. filed Nov. 23, 2009.
Final Office Action dated Aug. 14, 2014 for U.S. Appl. No. 13/354,175 of Higashi, G. et al. filed Jan. 19, 2012.
Final Office Action dated Feb. 1, 2016 for U.S. Appl. No. 12/904,047 of Atwater, H. et al. filed Oct. 13, 2010.
Final Office Action dated Feb. 8, 2016 for U.S. Appl. No. 13/772,043 of Archer, M.J. et al. filed Feb. 20, 2013.
Final Office Action dated Jan. 29, 2016 for U.S. Appl. No. 13/446,876 of Kayes, B.M. et al. filed Apr. 13, 2012.
Final Office Action dated Mar. 4, 2016 for U.S. Appl. No. 14/696,106 of Kayes, Brendan M. filed Apr. 24, 2015.
Final Office Action dated Mar. 8, 2017 for U.S. Appl. No. 15/006,003 of Kayes, B.M. et al. filed Jan. 25, 2016.
Final Office Action dated Nov. 6, 2015 for U.S. Appl. No. 13/705,064 of Kayes, B.M. et al. filed Dec. 4, 2012.
Final Office Action dated Oct. 18, 2011, for U.S. Appl. No. 12/940,876 of Kizilyalli, I.C. et al. filed Nov. 10, 2010.
Final Office Action dated Oct. 28, 2016 for U.S. Appl. No. 14/846,675 of Kayes, B.M. et al. filed Sep. 4, 2015.

(56) References Cited

OTHER PUBLICATIONS

Final Office Action dated Sep. 11, 2017 for U.S. Appl. No. 12/904,047 of Atwater, H. et al. filed Oct. 13, 2010.
Final Office Action dated Sep. 16, 2011 for U.S. Appl. No. 12/940,861 of Kizilyalli, I.C. et al. filed Nov. 5, 2010.
Final Office Action dated Sep. 22, 2017 for U.S. Appl. No. 13/772,043 of Archer, M.J. et al. filed Feb. 20, 2013.
International Search Report and Written Opinion dated Jun. 1, 2010 for International Application No. PCT/US2009/061898.
International Search Report and Written Opinion dated Jun. 1, 2010 for International Application No. PCT/US2009/061906.
International Search Report and Written Opinion dated Jun. 1, 2010 for International Application No. PCT/US2009/061911.
International Search Report and Written Opinion dated Jun. 1, 2010 for International Application No. PCT/US2009/061914.
International Search Report and Written Opinion dated Jun. 1, 2010 for International Application No. PCT/US2009/061920.
International Search Report and Written Opinion dated Dec. 2, 2016 for International Patent Application No. PCT/US2016/052939, 12 pages.
International Search Report and Written Opinion dated May 23, 2016 for International Patent Application No. PCT/US2016/014866, 12 pages.
International Search Report and Written Opinion dated May 8, 2017 for International Patent Application No. PCT/US2017/015387, 10 pages.
Non-Final Office Action dated Apr. 25, 2015 for U.S. Appl. No. 13/705,064 of Kayes, B.M. et al. filed Dec. 4, 2012.
Non-Final Office Action dated Apr. 7, 2016 for U.S. Appl. No. 13/705,064 of Kayes, B.M. et al. filed Dec. 4, 2012.
Non-Final Office Action dated Apr. 7, 2016 for U.S. Appl. No. 14/846,675 of Kayes, B.M. et al. filed Sep. 4, 2015.
Non-Final Office Action dated Apr. 7, 2017 for U.S. Appl. No. 13/772,043 of Archer, M.J. et al. filed Feb. 20, 2013.
Non-Final Office Action dated Aug. 16, 2017 for U.S. Appl. No. 14/846,675 of Kayes, B.M. et al. filed Sep. 4, 2015.
Non-Final Office Action dated Aug. 19, 2011 for U.S. Appl. No. 12/605,108 of Kizilyalli, I.C. et al. filed Nov. 23, 2009.
Non-Final Office Action dated Jan. 16, 2014 for U.S. Appl. No. 12/904,047 of Atwater, H. et al. filed Oct. 13, 2010.
Non-Final Office Action dated Jan. 30, 2014 for U.S. Appl. No. 13/354,175 of Higashi, G. et al. filed Jan. 19, 2012.
Non-Final Office Action dated Jul. 16, 2015 for U.S. Appl. No. 13/446,876 of Kayes, B.M. et al. filed Apr. 13, 2012.
Non-Final Office Action dated Jul. 16, 2015 for U.S. Appl. No. 13/772,043 of Archer, M.J. et al. filed Feb. 20, 2013.
Non-Final Office Action dated Jul. 30, 2015 for U.S. Appl. No. 12/904,047 of Atwater, H. et al. filed Oct. 13, 2010.
Non-Final Office Action dated Jun. 28, 2016 for U.S. Appl. No. 13/446,876 of Kayes, B.M. et al. filed Apr. 13, 2012.
Non-Final Office Action dated Mar. 17, 2011, for U.S. Appl. No. 12/940,861 of Kizilyalli, I.C. et al. filed Nov. 5, 2010.
Non-Final Office Action dated Mar. 17, 2011, for U.S. Appl. No. 12/940,876 of Kizilyalli, I.C. et al. filed Nov. 10, 2010.
Non-Final Office Action dated May 11, 2017 for U.S. Appl. No. 14/692,647 of Kayes, Brendan M. et al. filed Apr. 21, 2015.
Non-Final Office Action dated May 31, 2016 for U.S. Appl. No. 12/904,047 of Atwater, H. et al. filed Oct. 13, 2010.
Non-Final Office Action dated Nov. 17, 2010 for U.S. Appl. No. 12/605,108 of Kizilyalli, I.C. et al. filed Nov. 23, 2009.
Non-Final Office Action dated Nov. 17, 2015 for U.S. Appl. No. 14/696,106 of Kayes, Brendan M. filed Apr. 24, 2015.
Non-Final Office Action dated Sep. 22, 2016 for U.S. Appl. No. 15/006,003 of Kayes, B.M. et al. filed Jan. 25, 2016.
Non-Final Office Action dated Sep. 26, 2013 for U.S. Appl. No. 13/772,043 of Archer, M.J. et al. filed Feb. 20, 2013.
Notice of Allowance dated Aug. 12, 2014, for U.S. Appl. No. 12/940,876 of Kizilyalli, I.C. et al. filed Nov. 10, 2010.
Notice of Allowance dated Aug. 17, 2015 for U.S. Appl. No. 14/452,393 of Ding, I.-K. et al. filed Aug. 5, 2014.
Notice of Allowance dated Aug. 26, 2016 for U.S. Appl. No. 14/696,106 of Kayes, Brendan M. filed Apr. 24, 2015.
Notice of Allowance dated Dec. 20, 2017 for U.S. Appl. No. 14/692,647 of Kayes, Brendan M. et al. filed Apr. 21, 2015.
Notice of Allowance dated Jan. 2, 2015 for U.S. Appl. No. 13/354,175 of Higashi, G. et al. filed Jan. 19, 2012.
Notice of Allowance dated Jul. 13, 2014 for U.S. Appl. No. 12/940,861 of Kizilyalli, I.C. et al. filed Nov. 5, 2010.
Notice of Allowance dated Jul. 27, 2016 for U.S. Appl. No. 14/452,393 of Ding, I.-K. et al. filed Aug. 5, 2014.
Notice of Allowance dated Jun. 19, 2014 for U.S. Appl. No. 12/605,108 of Kizilyalli, I.C. et al. filed Nov. 23, 2009.
Notice of Allowance dated Jun. 2, 2015 for U.S. Appl. No. 13/354,175 of Higashi, G. et al. filed Jan. 19, 2012.
Notice of Allowance dated Mar. 4, 2016 for U.S. Appl. No. 14/452,393 of Ding, I.-K. et al. filed Aug. 5, 2014.
Notice of Allowance dated May 5, 2017 for U.S. Appl. No. 13/705,064 of Kayes, B.M. et al. filed Dec. 4, 2012.
Notice of Allowance dated Oct. 20, 2016 for U.S. Appl. No. 12/904,047 of Atwater, H. et al. filed Oct. 13, 2010.
Notice of Allowance dated Feb. 27, 2015 for U.S. Appl. No. 13/451,455 of Nie, H. et al. filed Jul. 19, 2012.
Notice of Allowance dated Jan. 26, 2015 for U.S. Appl. No. 13/451,455 of Nie, H. et al. filed Jul. 19, 2012.
Notice of Allowance with Corrected Notice of Allowability dated Feb. 28, 2017 for U.S. Appl. No. 12/904,047 of Atwater, H. et al. filed Oct. 13, 2010.
Restriction Requirement dated Dec. 26, 2014 for U.S. Appl. No. 13/446,876 of Kayes, B.M. et al. filed Apr. 13, 2012.
Restriction Requirement dated Dec. 28, 2017 for U.S. Appl. No. 15/422,218 of Zhu, Y. et al. filed Feb. 1, 2017.
Restriction Requirement dated Dec. 9, 2015 for U.S. Appl. No. 14/846,675 of Kayes, B.M. et al. filed Sep. 4, 2015.
Restriction Requirement dated Jan. 22, 2013 for U.S. Appl. No. 12/904,047 of Atwater, H. et al. filed Oct. 13, 2010.
Restriction Requirement dated Jun. 22, 2016 for U.S. Appl. No. 15/006,003 of Kayes, B.M. et al. filed Jan. 25, 2016.
Restriction Requirement dated Nov. 18, 2016, for U.S. Appl. No. 14/692,647 of Kayes, Brendan M. et al. filed Apr. 21, 2015.
Restriction Requirement dated Oct. 24, 2014 for U.S. Appl. No. 13/705,064 of Kayes, B.M. et al. filed Dec. 4, 2012.
U.S. Appl. No. 13/705,064 of Kayes, B.M. et al. filed Dec. 4, 2012.
U.S. Appl. No. 13/772,043 of Archer, M.J. et al. filed Feb. 20, 2013.
U.S. Appl. No. 14/846,675 of Kayes, B.M. et al. filed Sep. 4, 2015.
U.S. Appl. No. 15/417,105 of Kayes, B.M. et al. filed Jan. 26, 2017.
U.S. Appl. No. 15/706,090 of Kayes, B.M. et al. filed Sep. 15, 2017.
U.S. Appl. No. 15/837,533 of Kayes, B.M. et al. filed Dec. 11, 2017.
Supplementary Search Report dated Sep. 18, 2017 for Chinese Patent Application No. 201510475349.5, 1 page.
First Office Action dated Jun. 5, 2014, for Chinese Patent Application No. 201080046469 filed Oct. 14, 2010, 23 pages, Jun. 5, 2014.
European Search Report dated Sep. 19, 2017 for European Patent Application No. 11187659.5, 11 pages.
Office Action dated Jun. 23, 2016, for Chinese Patent Application No. 201110329046.4.
Office Action dated Jun. 7, 2016 for Korean Patent Application No. 10-2012-7012346.
Final Office Action dated Jan. 26, 2017, for Korean Patent Application No. KR-20127012346, 4 pages.
Search Report dated Jun. 5, 2014, for Chinese Patent Application No. 201080046469 filed Oct. 14, 2010, 2 pages, Jun. 5, 2014.
Heckelmann, Stefan et al., "Investigations on $Al_xGa_{1-x}As$ Solar Cells Grown by MOVPE", IEEE Journal of Photovoltaics, IEEE, US, vol. 5, No. 1, Dec. 18, 2014, pp. 446-453.
Hübner, A. et al., "Novel cost-effective bifacial silicon solar cells with 19.4% front and 18.1% rear efficiency", Applied physics letters 70(8), 1997, pp. 1008-1010.
Kang, et al., "Ultra-thin Film Nano-structured Gallium Arsenide Solar Cells", Proc. of SPJE, vol. 9277, No. 927718, pp. 1-7.
Lenkeit, B. et al., "Excellent thermal stability of remote plasma-enhanced chemical vapour deposited silicon nitride films for the rear of screen-printed bifacial silicon solar cells", Solar energy materials and solar cells 65(1), 2001, pp. 317-323.

(56) References Cited

OTHER PUBLICATIONS

Mathews, Ian et al., "GaAs solar cells for Indoor Light Harvesting", 2014 IEEE 40th Photovoltaic Specialist Conference (PVSC), IEEE, Jun. 8, 2014, pp. 510-513.
McClelland, R.W. et al., "High-Efficiency Thin-Film GaAs Bifacial Solar Cells", Proceedings of IEEE Photovoltaic Specialists Conference, 1990, May 21, 1990-May 25, 1990, pp. 145-147.
McPheeters, et al., "Computational analysis of thin film JnGaAs/GaAs quantum well solar cells with backside light trapping structures", Optics Express, Vcol. 20, No. S6, Nov. 5, 2012, pp. A864-A878.
Mellor, et al., "A numerical study of Bi-periodic binary diffraction gratings for solar cell applications", Solar Energy Materials & Solar Cells 95, 2011, pp. 3527-3535.
Ohtsuka, H. et al., "Effect of light degradation on bifacial Si solar cells", Solar energy materials and solar cells 66(1), 2001, pp. 51-59.
Van Geelen, A. et al., "Epitaxial lift-off GaAs solar cell from a reusable GaAs substrate", Materials Science and Engineering: B, vol. 45, No. 1-3, Mar. 1997, pp. 162-171.
Yang, et al., "Ultra-Thin GaAs Single-Junction Solar Cells Integrated with an AlInP Layer for Reflective Back Scattering", (4 total pages).
Yazawa, Y. et al., "GaInP single-junction and GaInP/GaAs two-junction thin-film solar cell structures by epitaxial lift-off", Solar Energy Materials and Solar Cells, vol. 50, No. 1-4, 1998, pp. 229-235.
Contreras et al., "Wide bandgap Cu(In,Ga)Se2 solar cells with improved energy conversion efficiency," Progress in Photovoltaics: Research and Applications, Apr. 2012, pp. 843-850, vol. 20, John Wiley & Sons. Ltd.
Non-Final Office Action issued in U.S. Appl. No. 15/422,218 dated May 9, 2018.

THIN-FILM SEMICONDUCTOR OPTOELECTRONIC DEVICE WITH TEXTURED FRONT AND/OR BACK SURFACE PREPARED FROM TEMPLATE LAYER AND ETCHING

CROSS-REFERENCE TO RELATED APPLICATIONS

This application is a Continuation of U.S. patent application Ser. No. 14/452,393, filed Aug. 5, 2014, which is a Continuation-in-Part Application of U.S. patent application Ser. No. 13/354,175, filed Jan. 19, 2012, now U.S. Pat. No. 9,136,422, Issued Sep. 15, 2015. The disclosure of the priority applications are hereby incorporated in their entirety by reference.

BACKGROUND

Field of the Invention

Embodiments of the invention generally relate to optoelectronic semiconductor devices, such as photovoltaic devices including solar cells, and methods for fabricating such devices.

Description of the Related Art

The use of optoelectronic devices, such as photovoltaic devices and light emitting diodes (LEDs), is becoming more widespread as energy efficiency increases in importance. In a photovoltaic device such as a solar cell, the junction of a solar cell absorbs photons to produce electron-hole pairs, which are separated by the internal electric field of the junction to generate a voltage, thereby converting light energy to electric energy. The absorber layer of an ideal photovoltaic (PV) device would absorb all of the photons impinging on the PV device's front side facing the light source since the open circuit voltage ($V_{oc}$) or short circuit current ($I_{sc}$) is proportional to the light intensity. However, several loss mechanisms typically interfere with the PV device's absorber layer absorbing all of the light reaching the front side of the device. For example, some photons may pass through the absorber layer without affecting any electron-hole pairs and thus never contribute to generating electrical energy by the device. In other cases, the semiconductor layers of the PV device may be shiny and, therefore, may reflect a substantial portion of the impinging photons, preventing these photons from ever reaching the absorber layer.

Accordingly, there is a need for optoelectronic devices with increased efficiency and methods for fabricating such optoelectronic devices at reduced costs and greater flexibility when compared to conventional optoelectronic device fabrication.

SUMMARY

A method for providing a textured layer in an optoelectronic device is disclosed. The method includes depositing a template layer on a first layer. The template layer is significantly inhomogeneous either in thickness or in composition, including the possibility of forming one or more islands to provide at least one textured surface of the island layer. The method also includes exposing the template layer and the first layer to an etching process to create or alter at least one textured surface. The at least one textured surface is operative to cause scattering of light.

A method for providing an optoelectronic device is disclosed. The method includes depositing an absorber layer and depositing an emitter layer. The method also includes depositing a first layer of a first material over the emitter layer and the absorber layer. In addition, the method includes depositing a template layer of a second material on the first layer. The method further includes exposing the template layer and the first layer to an etching process to create or alter at least one textured surface. The at least one textured surface is operative to cause scattering of light. Finally, the method includes depositing a dielectric layer over the island layer and depositing a metal layer over the dielectric layer.

A method for providing an optoelectronic device is disclosed. The method includes depositing an emitter layer and depositing an absorber layer. The method also includes depositing a first layer of a first material over the emitter layer and the absorber layer. In addition, the method includes depositing a template layer of a second material on the first layer. The method further includes exposing the template layer and the first layer to an etching process to create or alter at least one textured surface. The at least one textured surface is operative to cause scattering of light. Finally, the method includes depositing an anti-reflective layer over the island layer.

BRIEF DESCRIPTION OF THE DRAWINGS

The appended drawings illustrate only some embodiments and are therefore not to be considered limiting of scope.

DETAILED DESCRIPTION

Embodiments of the inventions generally relate to optoelectronic devices and processes, and more specifically to optoelectronic semiconductor devices including one or more textured layers and the fabrication processes for forming such optoelectronic devices.

Herein, a layer can be described as being deposited "over" one or more other layers. This term indicates that the layer can be deposited directly on top of the other layer(s), or can indicate that one or more additional layers can be deposited between the layer and the other layer(s) in some embodiments. Also, the other layer(s) can be arranged in any order.

Herein term template layer is defined to indicate a layer that has significant inhomogeneity either in thickness or in composition, or both. This includes the possibility that the thickness inhomogeneity is so great that the template layer is a plurality of separated islands. When the template layer and the layers underneath the template layer are exposed to an etchant or etching process, a textured surface is created or altered. The textured surface is able to cause scattering of light, which can improve light trapping in an optoelectronic device.

Figure 1A:
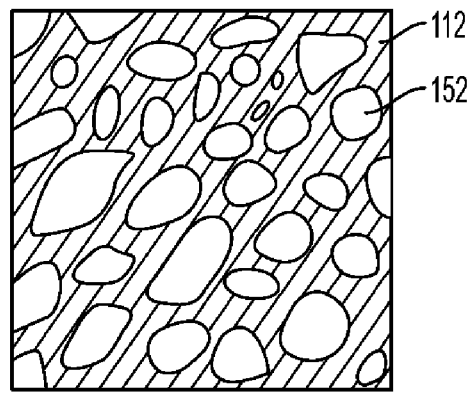
FIGS. 1A-1C show a top-down view of a template island layer above a first layer.
Figure 1B:
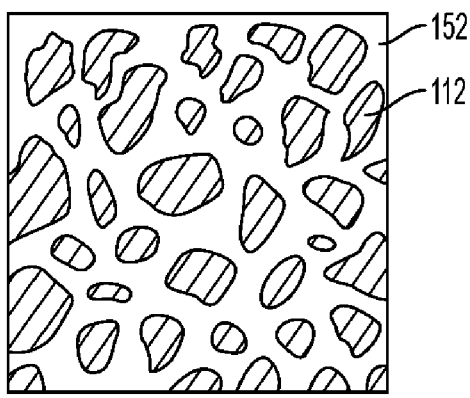
Figure 10:
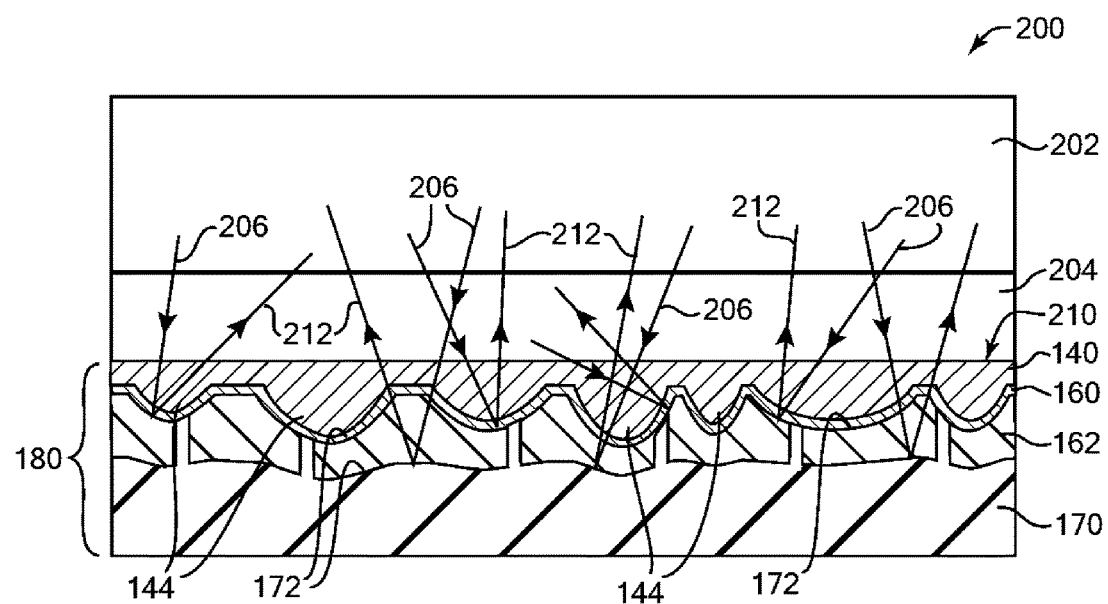
FIG. 10 depicts a cross-sectional view of a photovoltaic cell illustrating scattering of light by a textured layer on a back side of a device.

The term island refers to a layer of material that is discontinuous in the plane, allowing an etchant to potentially reach the layer below. An island layer may either form a plurality of distinct disconnected regions (FIG. 1A), or may be fully connected but with gaps (FIG. 1B), or may be a combination of both (FIG. 10). Each of these figures shows a top-down view of a template island layer 152 above a first layer 112. These layers are described in more detail herein.

Embodiments disclosed herein relate to light trapping using textured layer(s) for greater device efficiency.

Figure 2:
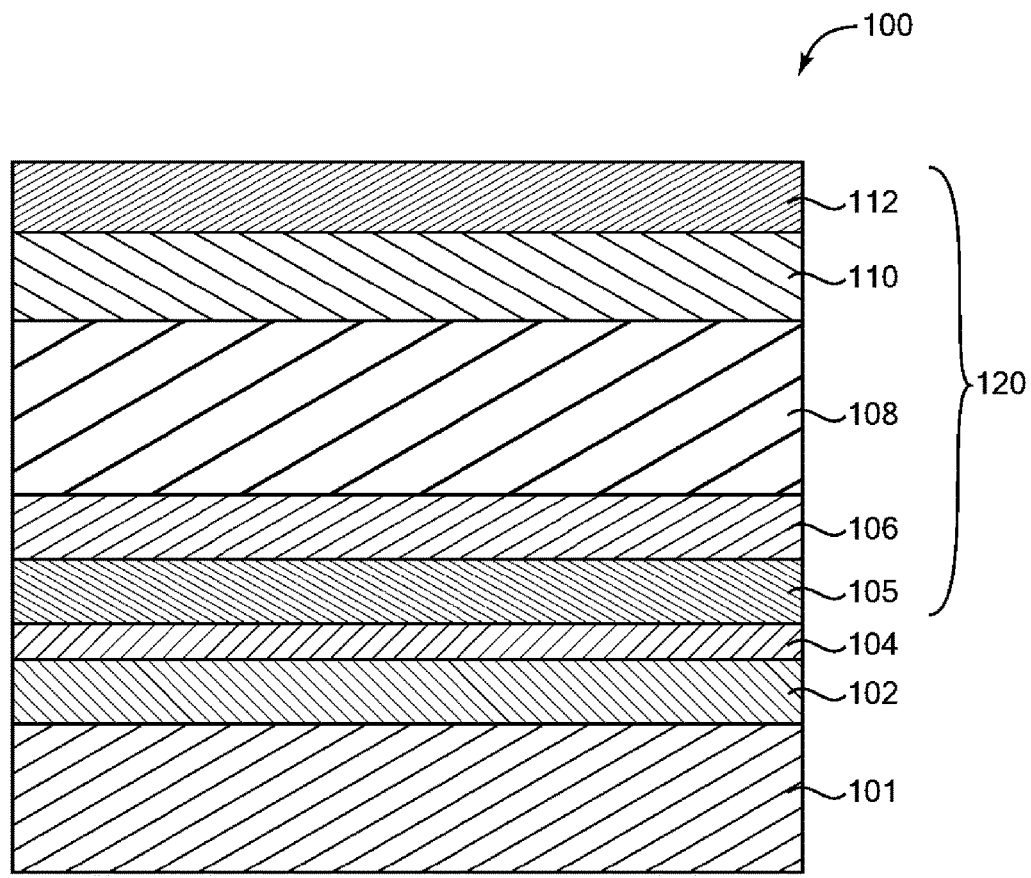
FIG. 2 depicts a cross-sectional view of a photovoltaic device in accordance with some embodiments described herein.

FIG. 2 illustrates a cross-sectional view of one embodiment of a photovoltaic device 100 suitable for use with embodiments described herein. Although examples herein relate to photovoltaic devices, described features can also be applied to other optoelectronic semiconductor devices, such as LEDs, e.g., to scatter light in the device to provide increased or more efficient light generation.

Device 100 includes a cell 120 coupled with a growth wafer 101 by an ELO release layer or sacrificial layer 104 disposed therebetween. Multiple layers of epitaxial materials containing varying compositions are deposited within the photovoltaic device 100. The various layers of epitaxial materials may be grown or otherwise formed by a suitable method for semiconductor growth. Cell 120 can be, for example, a gallium arsenide based cell with layers made of Group III-V materials. The Group III-V materials are thin films of epitaxially grown layers. In some embodiments the epitaxially grown layers can be formed by growing Group III-V materials during, for example, a high growth rate vapor deposition process. A high growth rate deposition process allows for growth rates of greater than 5 µm/hr, such as about 10 µm/hr or greater, or as high as about 100 µm/hr or greater. The high growth rate process includes heating a wafer to a deposition temperature of about 550° C. or greater, within a processing system, exposing the wafer to a deposition gas containing a chemical precursor, such as gallium precursor gas and arsine for a gallium arsenide deposition process, and depositing a layer containing gallium arsenide on the wafer. The deposition gas may contain a Group V precursor, such as arsine, phosphine, or ammonia.

The deposition processes for depositing or forming Group III-V materials, as described herein, can be conducted in various types of deposition chambers. For example, one continuous feed deposition chamber that may be utilized for growing, depositing, or otherwise forming Group III-V materials is described in the commonly assigned U.S. patent application Ser. Nos. 12/475,131 and 12/475,169, both filed on May 29, 2009, which are herein incorporated by reference in their entireties.

Some examples of layers usable in device 100 and methods for forming such layers are disclosed in copending U.S. patent application Ser. No. 12/939,077, filed Nov. 3, 2010, and incorporated herein by reference in its entirety.

In some embodiments, one or more buffer layers 102 may be formed on the growth wafer 101 in order to start forming the photovoltaic device 100. The growth wafer 101 may include, for example, an n-type or semi-insulating material, and may include the same or similar material as the one or more subsequently deposited buffer layers. A p-type material can be included in other embodiments.

A sacrificial layer (ELO release layer) 104 can be deposited on the growth wafer 101 or buffer layer 102 (if present). The sacrificial layer 104 can contain a suitable material, such as aluminum arsenide (AlAs) or an aluminum arsenide alloy, and is utilized to form a lattice structure for the layers contained within the cell 120, and then etched and removed during the ELO process.

Layers of the photovoltaic cell 120 can be deposited over the sacrificial layer 104, which in some embodiments can include a front contact layer 105, a front window 106, an absorber layer 108 formed adjacent the front window 106, an emitter layer 110, and a base layer 112 for texturing. The front semiconductor contact layer 105, or interface layer, can be deposited on the sacrificial layer 104. The front contact layer 105 can, in some embodiments, be an n-doped layer comprising Group III-V materials, such as gallium arsenide.

A front window 106, also known as a passivation layer, can be formed above the substrate 101 on the sacrificial layer 104, or if present, on the optional contact layer 105. The front window 106 may be transparent to allow incident photons to pass through the front window 106 on the front side of the cell 120 to other underlying layers. In some examples, the front window 106 may comprise a Group III-V material.

An absorber layer 108 can be formed above the window layer 106. The absorber layer 108 can comprise any suitable Group III-V compound semiconductor, such as gallium arsenide (GaAs). In some embodiments, the absorber layer 108 can be monocrystalline and can be n-doped. Different embodiments can provide different doping concentrations, such as a range from about $1 \times 10^{16}$ cm$^{-3}$ to about $1 \times 10^{19}$ cm$^{-3}$.

An emitter layer 110 may be formed above the absorber layer 108 in some embodiments. The emitter layer 110 can, in some embodiments, be p-doped (e.g., p$^+$-doped). The emitter layer 110 may comprise any suitable Group III-V compound semiconductor and can be monocrystalline. For example, the doping concentration of a heavily p-doped emitter layer 110 may be within a range from about $1 \times 10^{17}$ cm$^{-3}$ to about $1 \times 10^{20}$ cm$^{-3}$. In some embodiments, the emitter layer 110 can form a heterojunction with the absorber layer 108.

In some embodiments, the contact of an n-type absorber layer 108 with a p-type emitter layer 110 creates a p-n junction for absorbing photons. Other embodiments can include one or more intermediate layers between absorber layer 108 and emitter layer 110. Other embodiments may use a p-doped base/absorber layer and an n-doped back/emitter layer, and/or other p-/n-doped layers in place of n-/p-doped layers in the descriptions herein.

A base layer 112 for texturing can optionally be deposited over the emitter layer 110. The base layer 112 can provide a first layer on which a template layer is deposited for texturing purposes, and may contribute to island formation by having a different composition than the template layer. In some embodiments, the base layer 112 can be monocrystalline and p-doped and have a doping concentration in a range of about $5 \times 10^{17}$ cm$^{-3}$ to about $2 \times 10^{19}$ cm$^{-3}$. The base layer 112 and template layer are described in greater detail below. In some other embodiments, the base layer 112 is not included in the device 100. For example, the template layer (described below) can be deposited on the emitter layer 110, or on the absorber layer 108 if positioned above the emitter layer.

Figure 3A:
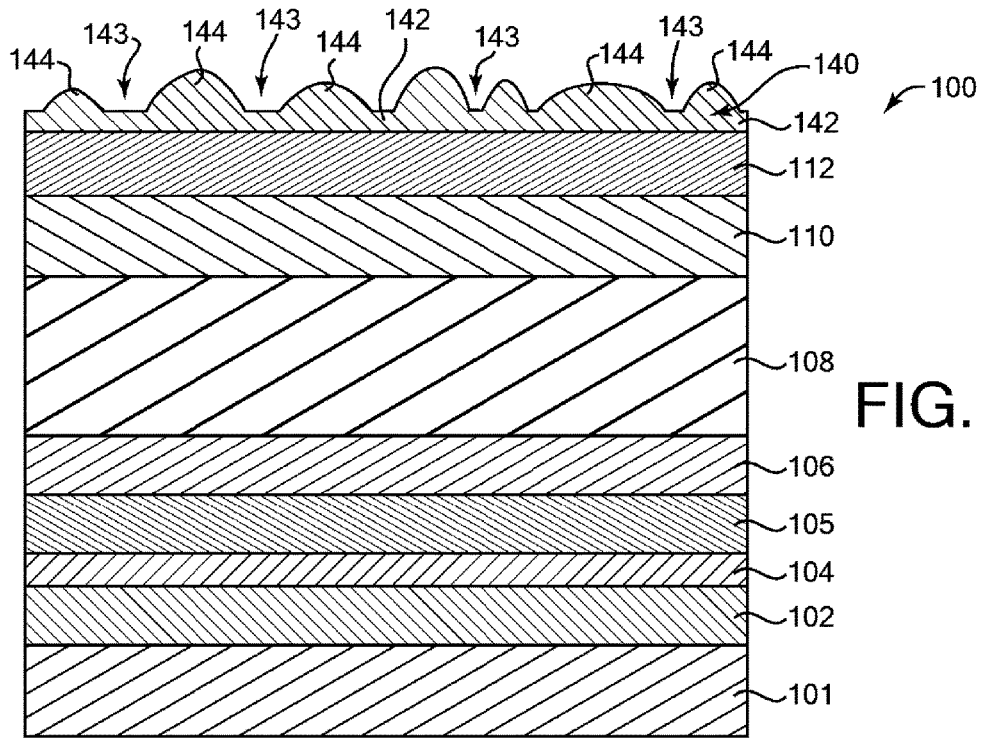
FIGS. 3A 3B, 3C, 3D, 3E, 3F, 3G, and 3H depict cross-sectional views of the photovoltaic device of FIG. 1 in which an island layer has been deposited over a base layer.

FIG. 3A is a cross-sectional view of the photovoltaic device 100 including a deposition of a template layer 140 on the base layer 112 according to one embodiment of a textured surface for use as a back reflector. The template layer 140 has non-uniform thickness which can cause light reflection and scattering in the device, increasing light trapping.

The template layer used can vary in different embodiments. In one embodiment, the template layer has significant thickness non-uniformity, including the possibility of a plurality of distinct islands of template material. In another embodiment, the template layer has compositional non-uniformity, but may or may not have significant thickness non-uniformity.

When the template layer and other layers in the device are exposed to an etchant or an etching process template layer may not be significantly etched, or may be etched but at a slower rate than is the first layer on which the template layer is deposited, or may be etched at a rate comparable to or greater than is the first layer on which the template layer is deposited. Thereby the template layer can, but need not be, completely etched away in the process of forming or altering the textured surface. Alternatively the template layer could be still partially or wholly present after the etching process but could be partially or wholly removed in subsequent processing steps prior to completion of fabrication of the optoelectronic device.

The template layer may have non-uniform composition. Different portions of the template layer with differing material compositions may be etched at different rates when exposed to the etchant or etching process. In this way, the template layer may develop thickness non-uniformity, or increase its thickness non-uniformity, during the process of etching, even if the thickness was uniform prior to etching.

Template layers with non-uniform thickness prior to etching may be termed generally as island layers. Island growth may develop, at least in part, due to strain between different materials caused by a lattice mismatch between the materials. Alternatively, island growth may develop due to the island layer being very thin and not forming a continuous layer. Alternatively, island growth may develop due to kinetic etching during the deposition process itself.

Figure 3B:
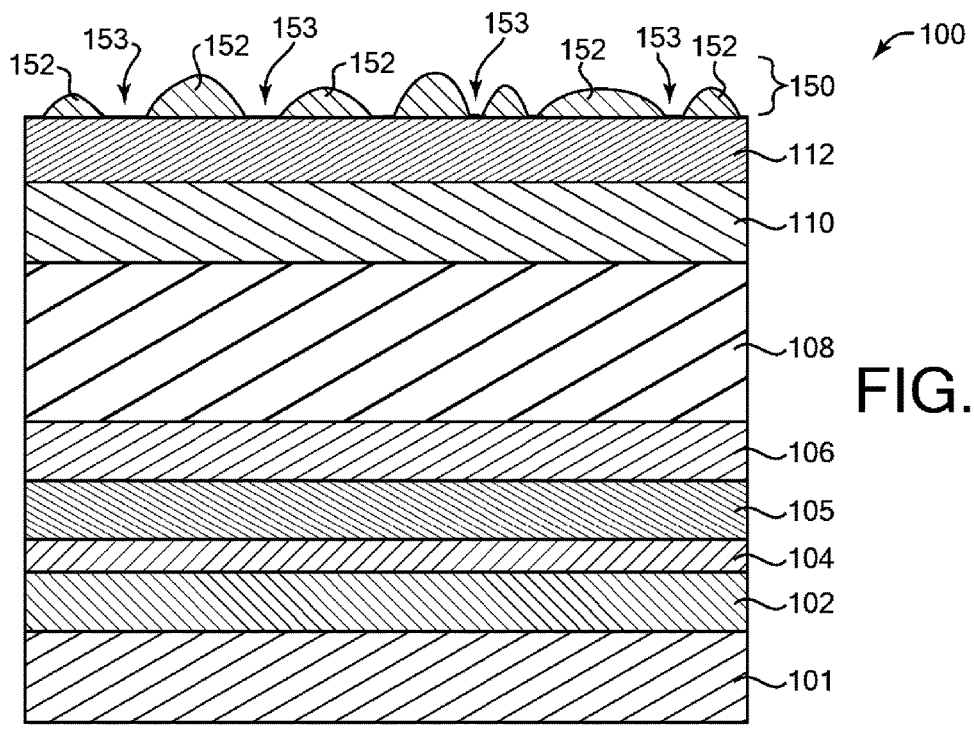

For example, in some embodiments, such as the example embodiment shown in FIG. 3A, the Stranski-Krastanov process can be used to form the template layer 140. This process involves depositing a particular material, which first forms a wetting layer 142 of the template layer material (which can include one more individual layers), followed by forming islands 144 of the same material on the wetting layer 142. In other embodiments, other types of island growth processes can be used. For example, FIG. 3B shows the formation of islands using a Volmer-Weber process which may not provide a wetting layer of the template layer material on which the islands grow, as described below.

The template layer 140 can comprise a semiconductor material, and can be a different material than the material of the base layer 112 upon which the template layer 140 is deposited. In some embodiments, the template layer 140 can be a material having a larger band gap than the material of the base layer 112. In some examples, the template layer 140 can comprise phosphorus, gallium, aluminum, indium, arsenic, antimony, nitrogen, derivatives thereof, and/or combinations thereof. For example, in some embodiments, the base layer 112 can comprise gallium arsenide (GaAs) or aluminum gallium arsenide (AlGaAs), and the template layer 140 can comprise indium gallium arsenide (InGaAs) or gallium arsenide antimonide (GaAsSb). In other embodiments, the base layer 112 can comprise aluminum gallium arsenide (AlGaAs) and the template layer 140 can comprise gallium phosphide (GaP). In other embodiments, the base layer 112 can comprise indium arsenide (InAs) and the template layer 140 can comprise indium arsenide antimonide (InAsSb). In still other embodiments, the base layer 112 can comprise gallium indium phosphide (GaInP) and the template layer 140 can comprise gallium phosphide (GaP) or aluminum phosphide (AlP). In still other embodiments, the base layer 112 can comprise indium phosphide (InP) and the template layer 140 can comprise indium phosphide antimonide (InPSb). In some embodiments, the template layer can comprise gallium indium nitride arsenide (GaInNAs), gallium nitride arsenide (GaNAs), gallium arsenide phosphide (GaAsP), aluminum gallium arsenide phosphide (AlGaAsP), or aluminum gallium phosphide (AlGaP). In any of these embodiments, derivatives and/or combinations of these materials can be used. Some embodiments can use a material for the template layer 140 that is doped; for example, the material can be p-doped, and can have a doping concentration in a range of about $1 \times 10^{17}$ cm$^{-3}$ to about $2 \times 10^{19}$ cm$^{-3}$, such as about $1 \times 10^{18}$ cm$^{-3}$.

In some embodiments, the template layer 140 comprises a material that has an index of refraction (n) and an absorption (k) that increases or maximizes the ability to scatter or reflect light. For example, template layer 140 can comprise a transparent material to allow light to pass through the template layer. The term "transparent" as used herein refers to a negligible amount of absorption in the wavelength range of operation of the optoelectronic device. For example, in some embodiments the template layer 140 can have an index of refraction in a range of about 1 to about 3.5. Furthermore, in some embodiments the material of the template layer 140 can have an absorption (k) in a range of about 0 to about $1 \times 10^{-2}$, such as about $1 \times 10^{-3}$ or about $1 \times 10^{-4}$. In some embodiments, the template layer 140 may comprise multiple transparent layers.

In some embodiments, various parameters of the deposition process may be changed or tuned for the deposition of the template layer 140, as compared to the deposition parameters used during deposition of previous layers such as the base layer 112. For example, the temperature, pressure, deposition gas, and/or growth rate of the deposition process can be changed, as described in greater detail below.

In FIG. 3A, the wetting layer 142 and islands 144 have been deposited on the base layer 112 using a Stranski-Krastanov process. The wetting layer includes complete films of adsorbates accumulated on a substrate, where the substrate is the base layer 112 in the described example. The wetting layer 142 can be grown with deposited material until a particular thickness is achieved, after which further deposition causes one or more islands 144 to grow. Islands 144 are thus comprised of the same material as the wetting layer 142. Once the wetting layer 142 has achieved a critical thickness in the Stranski-Krastanov process, as determined by the chemical and physical properties of the wetting layer 144 and base layer 112, continued growth of the adsorbate on the base layer 112 occurs through the accumulation of the islands 144 on the wetting layer 142 due to strain or stretch in the wetting layer material.

The islands 144 provide a textured surface of the island layer 140. The growth of the islands 144 is controlled to increase or maximize the angle randomization of light impinging on or transmitting through the template layer 140. This angle randomization of light can be increased or maximized by tuning or tailoring different parameters of the growth conditions, and therefore the growth, of the islands 144 so that the islands obtain particular characteristics. Some of the different parameters include the amount of material deposited for the template layer, the deposition temperature, deposition pressure, growth rate of the template layer material, Group V element flow in the deposition gas, and composition of the template material to affect the lattice mismatch between the base layer and template layer materials. The amount of template layer material deposited can affect island growth. For example, greater amounts of material deposited tend to encourage Stranski-Krastanov island growth over Volmer-Weber island growth (described in greater detail below).

Another parameter that can be selected to control the growth of the islands 144 includes the temperature provided during the deposition process of the island layer 140. For example, the temperature can be made higher to create islands 144 having larger dimensions. Some examples of temperature ranges used for depositing the template layer 140 include about 600° C. to about 900° C.

Another parameter for controlling the growth of the islands 144 is the pressure provided during the deposition of the template layer 140. For example, the pressure can be made greater to create islands 144 having smaller dimensions. Some examples of pressure ranges that can be used for depositing the template layer 140 include about 50 Torr to about 600 Torr.

Another parameter is the growth rate of the template layer 140 which can be controlled to affect textured layer characteristics. For example, in some embodiments using the Stranski-Krastanov process, the growth rate of the template layer 140 can be controlled to be faster than in standard, prior uses of the Stranski-Krastanov process. In one example, the growth rate can be controlled to be in accordance with the high growth rates of the other layers deposited for the photovoltaic device 100 as described above for the epitaxially grown layers. In other embodiments, the islands 144 can be grown more slowly, e.g., if in some embodiments better control over particular features of the islands are desired, such as facets. In some examples, a range of growth rates of greater than about 5 µm/hr for the template layer 140 material can be used.

Another parameter that can be controlled is the Group V element flow in the deposition gas provided during deposition. For example, the deposition gas for forming the template layer 140 can have a ratio of Group V precursor to Group III precursor. In some embodiments, the Group V element is phosphine. This flow ratio can be controlled to tune the template growth to desired characteristics. In general, for example, the phosphine flow ratio can be reduced (i.e., lower ratio provided) relative to the flow ratio used for the previously-deposited layer (e.g., the base layer 112) to promote islands to form. In some embodiments, the deposition gas can have a phosphine/Group III precursor in a range of about 50:1 to about 300:1.

Another parameter that can be selected to control the growth of the islands 144 is the composition (types) of materials used in the base layer 112 and the template layer 140. For example, materials can be selected based on the lattice parameters of the material of the contact layer 112 and of the material of the template layer 140. In general, the growth of the islands 144 depends in part on the lattice misfit between the base layer 112 and the template layer 140. For example, in a Stanski-Krastanov process, a greater mismatch between lattice parameters leads to smaller critical thicknesses of the wetting layer 142 at which point island growth starts to occur. The lattice parameters of the material of the base layer 112 and of the material of the template layer 140 can be selected to provide desired growth patterns or features of the islands 144, such as the form of the islands, the point at which the islands start growing after a wetting layer deposition, etc. In some example embodiments, a lattice mismatch in a range of about 3% to about 20% between the materials of the base layer 112 and the template layer 140 can be used. In some embodiments, the template layer 140 can be a material having a larger bandgap than the material of the base layer 112.

The islands 144 can be controlled to have particular or general physical characteristics, such as regular or irregular shape, dimensions and/or spacing. For example, island geometries and sizes can be controlled by controlling growth rate of the wetting layer and/or islands, controlling the critical thickness, using a textured or patterned base layer 112, etc.

In addition, the islands 144 can have a particular degree of variation or irregularity in some or all of their physical characteristics (e.g., dimensions, shape, and/or spacing) to provide varying, non-uniformly-shaped and non-uniformly-spaced islands 144. Such variation and randomized texture generally increases the ability to randomly scatter light received by the template layer into the absorber layer 108 as compared to a uniform texture.

Since the textured surface including template layer 140 is formed as a non-active scattering layer having features not provided within an absorber layer or emitter layer and exploits the shapes formed using an island growth deposition process, and since a greater degree of variation, irregularity or randomness is preferred in island 144 formation, a high-quality semiconductor is not necessary as the material of the template layer 140 in some embodiments. This can allow some reduction in cost of materials and/or processing compared to previous uses of island growth processes such as the Stranski-Krastanov process, in which precisely-dimensioned and precisely-spaced islands were grown in absorber layers of a device (e.g., for tuning wavelength emissions in semiconductor lasers). In addition, the use of lesser-quality semiconductors can allow higher growth rates of the template layer 140 in some embodiments.

FIG. 3B is a cross-sectional view of the photovoltaic device 100' including a deposition of an template layer 150 suitable for some embodiments disclosed herein, in which the islands are formed using a different island growth process. In FIG. 3B, a Volmer-Weber growth process has been used for island growth instead of the Stranski-Krastanov process used in the example of FIG. 3A.

Template layer 150 includes islands 152 which have been formed by depositing template layer material on the base layer 112 (or other layer in embodiments not having a base layer 112, as described above). Unlike the template layer 140 of FIG. 3A, the example template layer 150 does not include a wetting layer deposited before the islands form. The islands 152 form due to atoms on the surface of the base layer 112 having stronger interactions with the atoms of the island material than with the surface of the base layer. This causes clusters of material or islands 152 to form as the island material is deposited. Thus, some or all islands 152 may be formed directly on the surface of the base layer 112, and/or some or all islands 152 may have a layer of island material formed between the base layer 112 surface and the islands 152. Volmer-Weber island growth typically occurs at higher lattice mismatches between template layer and base layer, and on lower thicknesses of the template layer, compared to the Stranski-Krastanov growth described above. For example, Volmer-Weber island growth may occur at below about 5 angstroms thickness of the template layer in some embodiments.

Template layer 150 comprises a semiconductor material, and is a different material than the material of the base layer 112 upon which the template layer 150 is deposited. For example, in some embodiments, the template layer 150 can comprise phosphorus, gallium, aluminum, indium, arsenic, antimony, nitrogen, derivatives thereof, and/or combinations thereof. In some embodiments, the base layer 112 and template layer 150 can combinations or derivatives of materials of the materials described above for template layer 140. Some embodiments can use a material for template layer 150 that is doped.

Similarly as explained above for the embodiment of FIG. 3A, the growth of islands 152 can be controlled by tuning one or more various parameters of the deposition process, including the parameters described above.

Figure 3C:
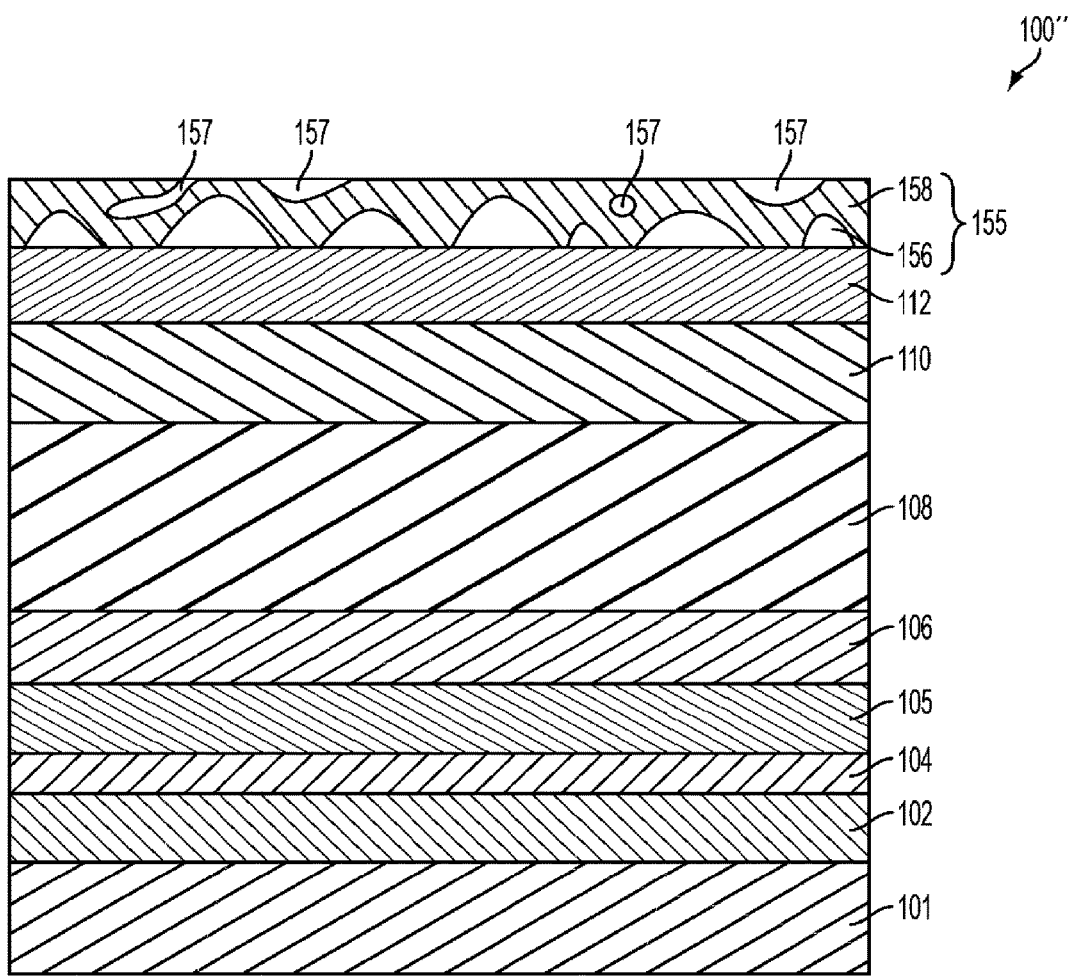

In another embodiment, the template layer has compositional non-uniformity, but may or may not have significant thickness non-uniformity. FIG. 3C is a cross-sectional view of the photovoltaic device 100" illustrating an example of such an embodiment. Template layer 155 is comprised of two or more material compositions, the first material shown unshaded as regions 156 and 157, and the second material shown shaded as region 158. FIG. 3C is intended to illustrate one example only, and is not intended to limit the scope of the invention. In particular, it is possible that there are more than two chemical compositions, that 156 and 157 have the same or different material compositions, and that 156 is a connected layer rather than disconnected islands as illustrated.

The embodiment of FIG. 3C having compositional non-uniformity is then susceptible to etching that could etch layers 156 and 158 at differing rates. In one embodiment, when the layers are exposed to an etchant or etching process layer 158 is etched more rapidly than layer 156, so that after etching the structure that remains is similar to that of FIG. 3B. Layer 156 from FIG. 3C then becomes equivalent to the island layer 152 of FIG. 3B.

Figure 3D:
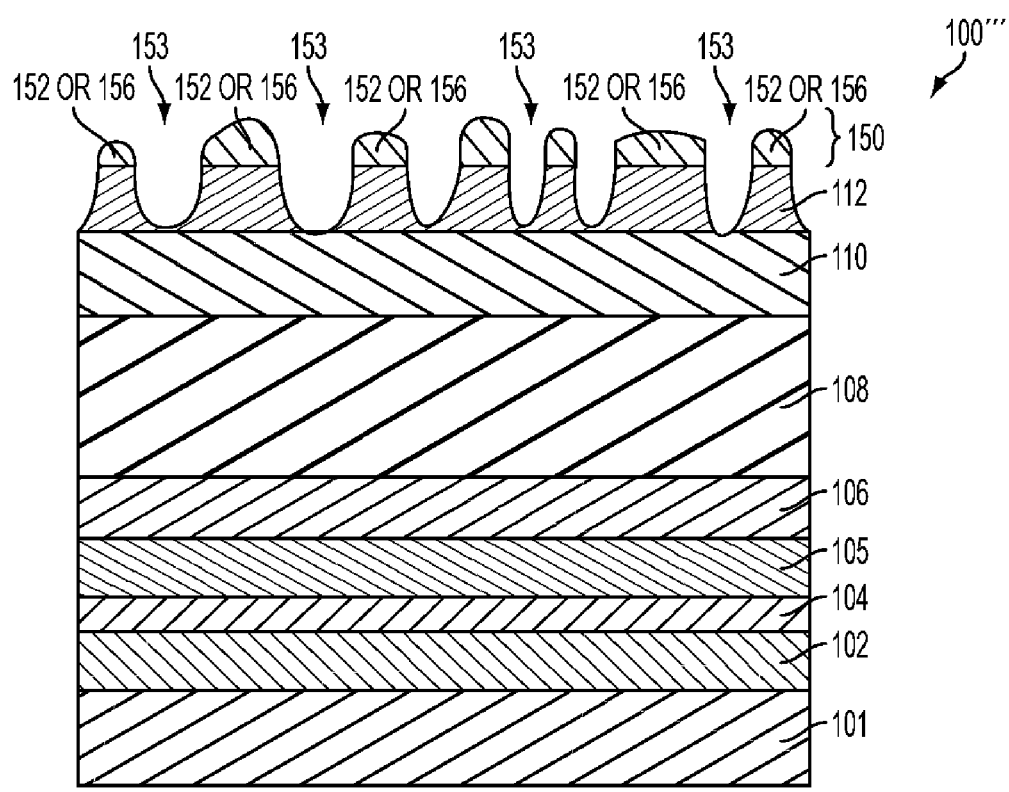

In some example embodiments, the template layer 155 can be comprised of two or more different compositions of a semiconductor or semiconductors such as aluminum gallium arsenide (AlGaAs) (e.g., with differing amounts of Al and Ga content), or aluminum gallium indium phosphide (AlGaInP) (e.g. with differing amounts of Al, Ga and/or In content), or other materials To further alter the islands 152 and provide rougher textures etching can be performed as shown in an alternate embodiment 100''' of FIG. 3D after the islands growth. The parameters of both the island growth and the etching can be controlled over the morphology and dimensions of the texture, thereby maximizing the benefit of the texture to the device performance. The altering of the islands 152 can include changing the physical dimensions of the textured surface, where the changed physical dimensions include changed shapes of one or more islands in the textured surface or changed distances among a plurality of islands in the textured surface. In various embodiments, the etching can be one or more of chemical etching, laser etching, plasma etching, or ion etching or the like.

In another embodiment, the layer 156 after removal of layer 158 provides the island template for further etching.

Figure 3E:
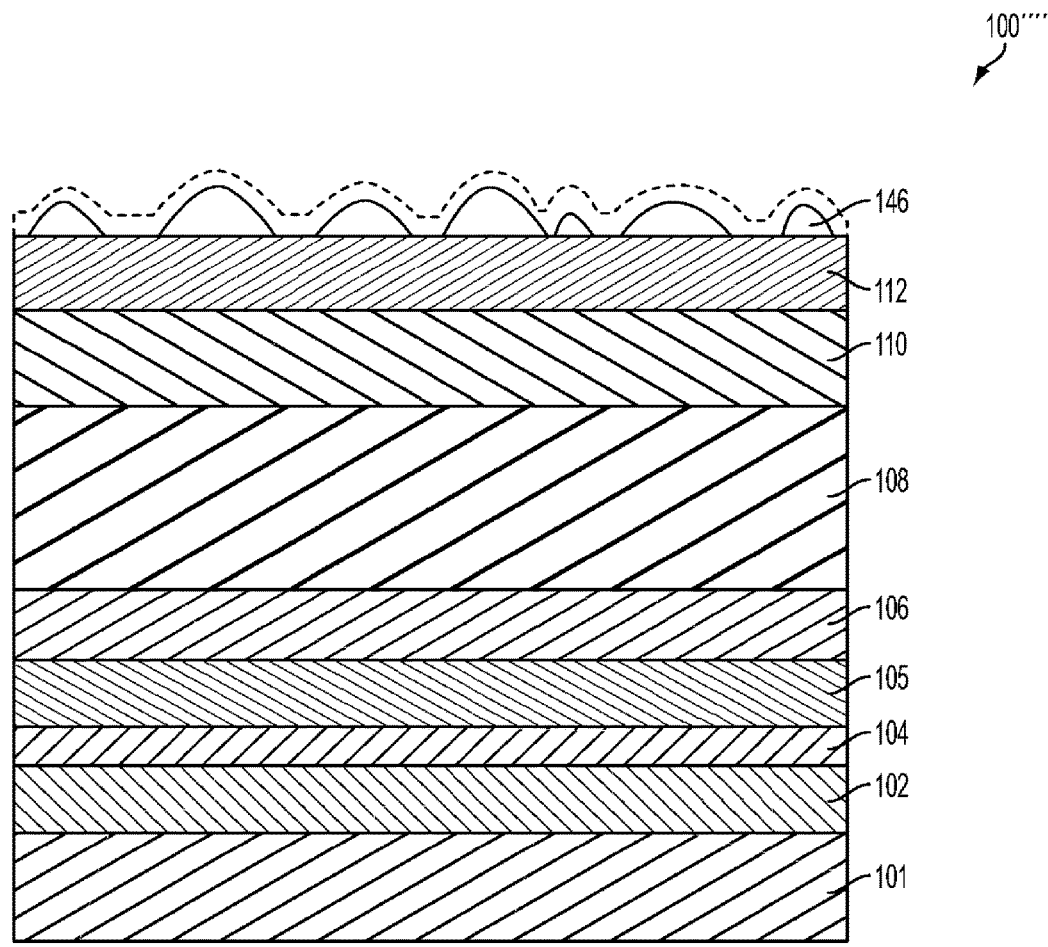
Figure 3F:
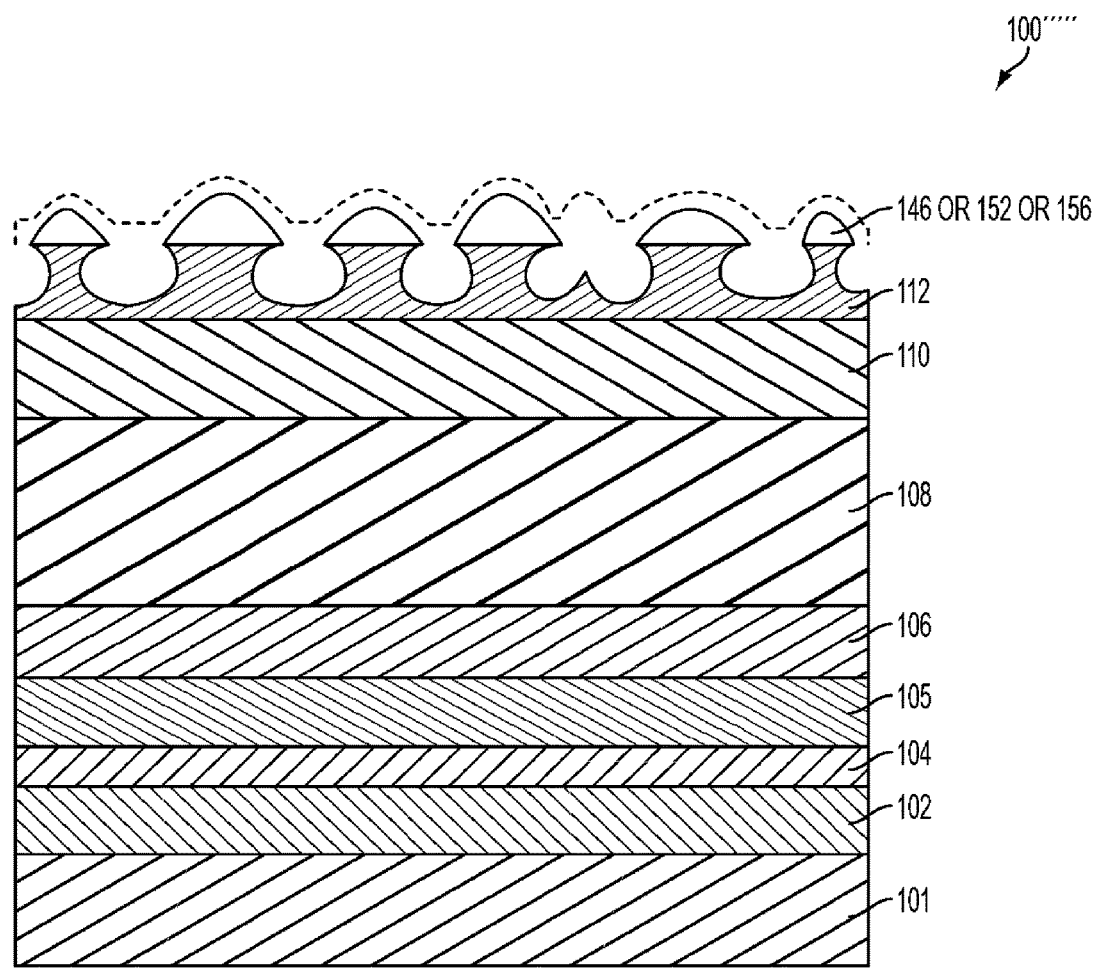
Figure 3G:
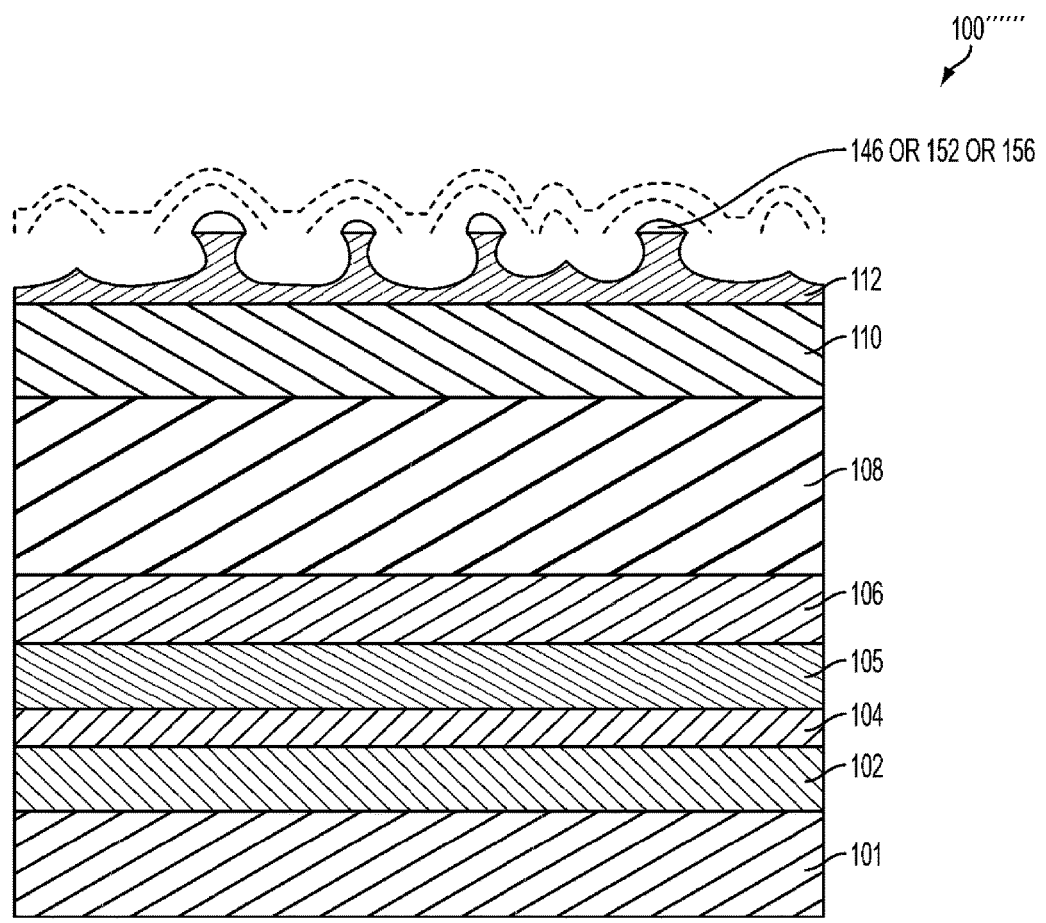

In another embodiment, layer 140 is partially etched to create an island template (FIG. 3E). The remainder of layer 140 after etching is labeled as 146. Further etching creates texture in layer 112 (FIG. 3F). FIG. 3F shows one embodiment where the etchant that etches layer 112 has negligible impact on layer 146. In yet another embodiment the etchant that etches layer 112 also significantly etches layer 146 (FIG. 3G). It is also possible for layer 146 to no longer be present after the etching of layer 112.

Figure 3H:
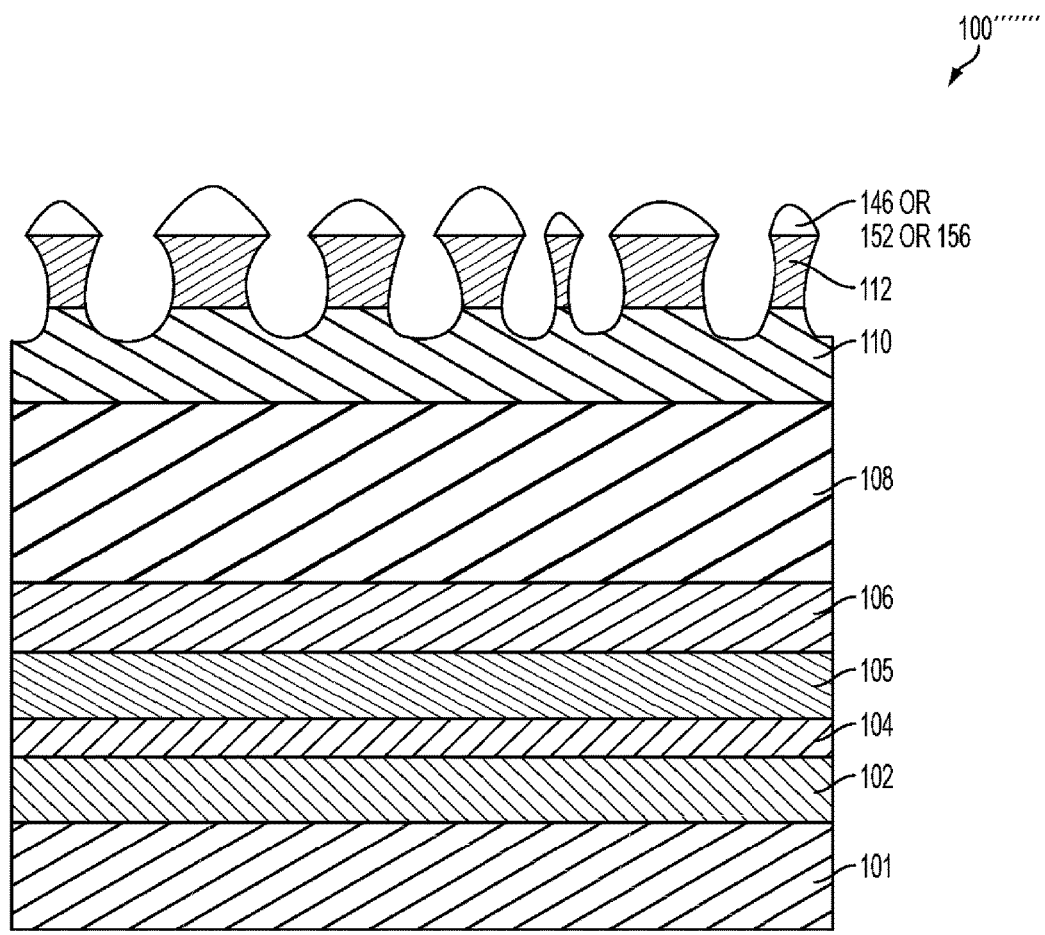

In yet another embodiment (FIG. 3H), etching is not restricted to layer 112 and those layers above layer 112, but rather extends also to layer 110. This can apply whether layer 146 or layer 152 or layer 156 is the island layer.

Figure 4:
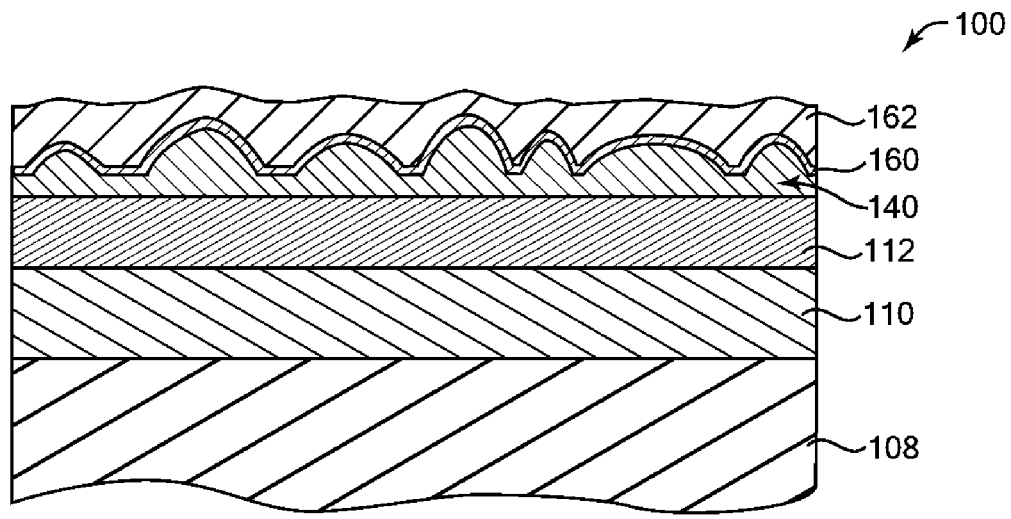
FIG. 4 depicts a cross-sectional view of the photovoltaic device of FIG. 3 in which a semiconductor contact layer and dielectric layer have been deposited over the island layer.

In FIG. 4, the photoelectric device 100 of FIG. 3B has been further developed by depositing an optional semiconductor contact layer 160 over the template layer 140, 150, or 155, followed by depositing a dielectric layer 162 over the contact layer (if present) or over the template layer 140, 150, or 155 (if contact layer 160 is not present). Template layer 140 is shown in the example Figures described below, where template layer 150 or 155 can be used in place of template layer 140 as desired. One of ordinary skill in the art readily recognizes that the photoelectric device 100' of FIG. 3B can be further developed in the same manner and that would be within the spirit and scope of the present invention. Furthermore the following description of device 100 applies equally to devices 100"-100""" of FIGS. 3A-3H. The semiconductor contact layer 160 can be deposited in some embodiments to, e.g., provide a cap on the template layer and to allow other layers to be more easily deposited over the template layer, and/or to provide a better ohmic contact for charge carrier movement in the device 100. In some example embodiments, the contact layer 160 can be comprised of a semiconductor such as gallium arsenide (GaAs) (e.g., with lower thicknesses since it can be less transparent), aluminum gallium arsenide (AlGaAs) (e.g., with higher thicknesses since it can be more transparent), or other materials, and can be p-doped in some embodiments, having a thickness in a range of about 5 nm to about 500 nm.

Dielectric layer 162 can be deposited over the contact layer 160 and/or the template layer 140, 150, or 155 in some embodiments, and can boost the reflection or scatting of light impinging on or traveling through the template layer 140, 150, or 155. In some examples, the dielectric layer 162 can comprise an insulating material such as silicon dioxide (SiO2), e.g., having a dielectric constant between the template semiconductor material and 1. In some embodiments, the dielectric layer 162 can be of a thickness of one-quarter wavelength (or multiple thereof) of the light intended to be scatted by the textured layer, and allows greater reflecting ability than only using a metal layer (described below). In some embodiments, the dielectric layer can have a lower refractive index n than the template layer 140, 150, or 155.

Thus, the islands 144 or 152 can form recesses in the layer(s) deposited above the template layer, such that in a back reflector embodiment, light traveling through the material of the template layer 140, 150, or 155 impinges on and reflects off (e.g., is scattered by) the surfaces of the recesses. Some examples are shown in greater detail with respect to FIG. 10.

In some other embodiments, a different material can be deposited instead of dielectric layer 162 over the semiconductor layer 160 or over the template layer 140, 150, or 155 (if contact layer 160 is not present). For example, in some embodiments, a transparent conducting oxide (TCO) layer can be deposited to provide boosted reflection abilities similar to a dielectric layer, and also provide a conductive path for charge carriers between the template layer and a conductive metal layer provided over the TCO layer. In these embodiments, apertures such as described for the dielectric layer 162 in FIG. 5 may not need to be formed in the TCO layer. In some embodiments, a high-resistivity transparent (HRT) layer can also be provided between the TCO layer and a semiconductor layer (such as template layer 140/150/155, emitter layer 110, or absorber layer 108). The HRT layer can reduce shunting of charge carriers through pin holes in the semiconductor material.

Figure 5:
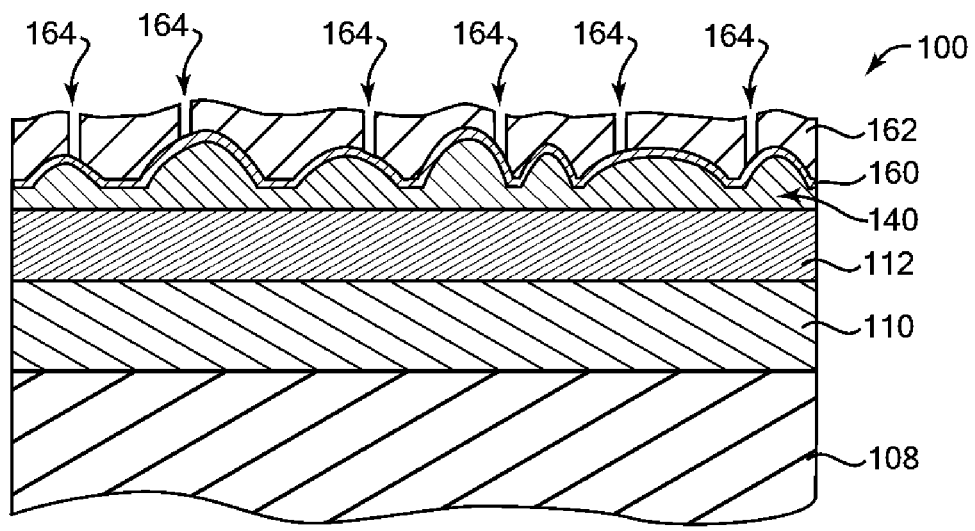
FIG. 5 depicts a cross-sectional view of the photovoltaic device of FIG. 4 in which apertures have been formed in the dielectric layer.

FIG. 5 illustrates the device 100 after apertures have been formed in the dielectric layer 162 to allow a conductive contact through the dielectric layer 162. In embodiments having the semiconductor contact layer 160, such as the example embodiment shown in FIG. 5, apertures 164 are formed through the dielectric layer 162 from the surface of the dielectric layer 162 to the semiconductor contact layer 160. In other embodiments having no semiconductor contact layer 160, the apertures 164 can be formed from the surface of the dielectric layer to the template layer 140, 150, or 155.

In some embodiments, the apertures 164 are formed by etching using an etching process. The etching process can be performed using any of available suitable techniques.

Figure 6A:
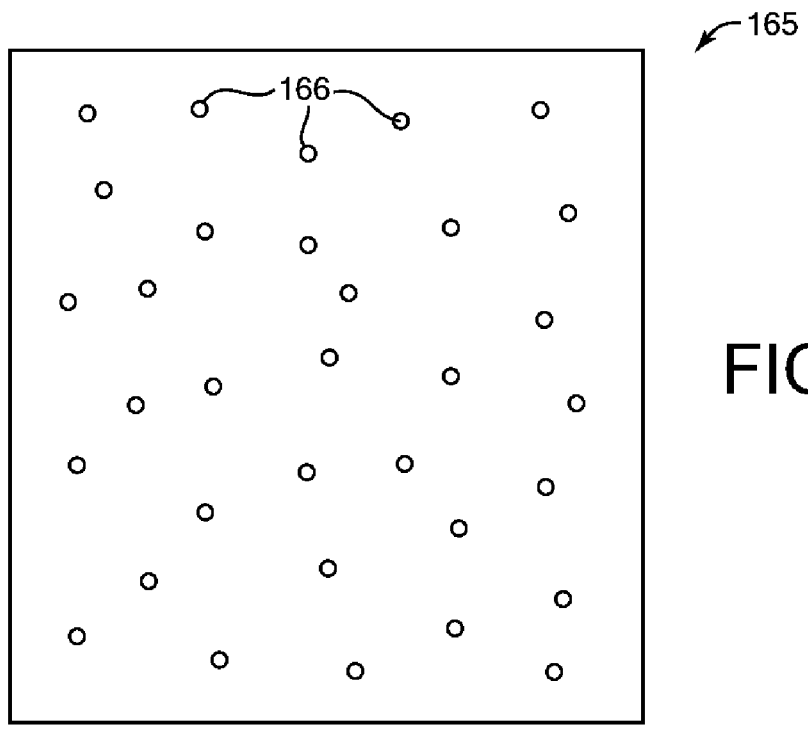
FIGS. 6A and 6B depict top plan views of different embodiments of masks which can be used to form apertures in the dielectric layer shown in FIG. 5.
Figure 6B:
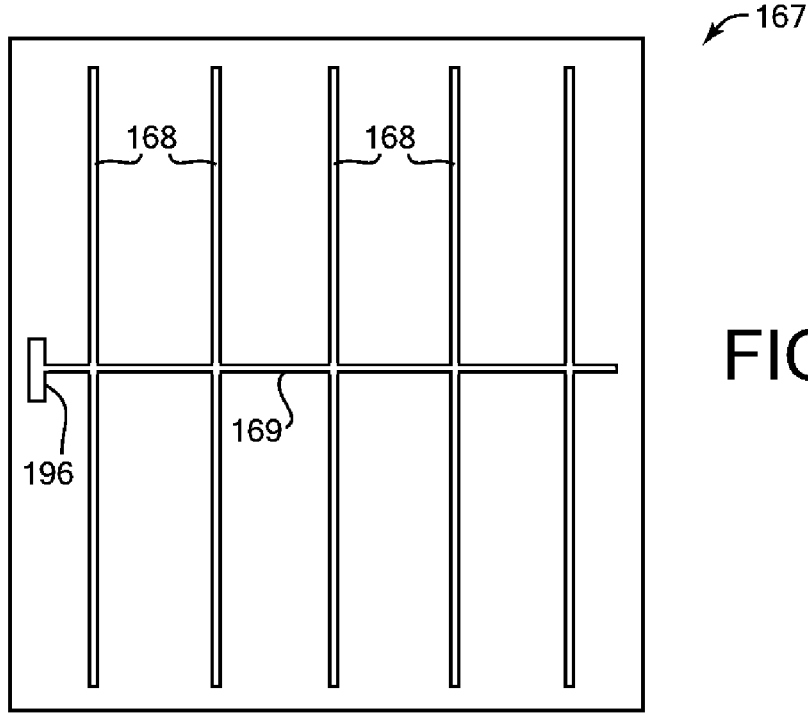

In some example embodiments, a particular pattern of apertures 164 in the dielectric layer 162 can be provided with a mask such as a photoresist/etching mask. FIG. 6A shows one example of a top view of a mask pattern 165 providing apertures 164 in the dielectric layer 162, in which the apertures are circular holes 166 having an approximately circular cross section (approximately circular in the top view of FIG. 6A). FIG. 6B shows another example of a top of view of a mask pattern 167 providing apertures 164 in the dielectric layer 162, in which the apertures are linear grooves. One or more grooves 168 can intersect one or more other grooves 169 as shown. The grooves can be positioned approximately parallel and/or perpendicular to each other as shown, or can be positioned at various other angles in other embodiments. Non-linear or irregular grooves can be used in other embodiments.

Figure 7:
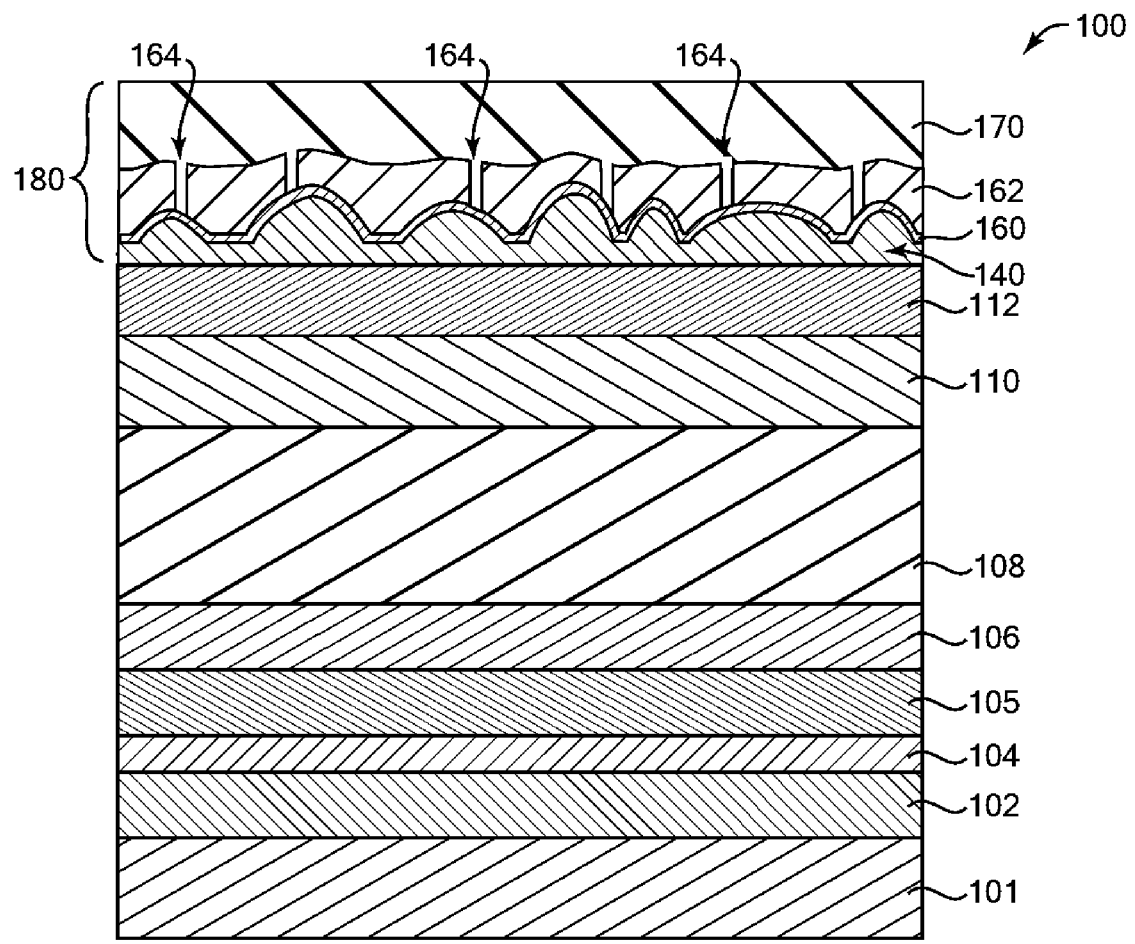
FIG. 7 depicts a cross-sectional view of the photovoltaic device of FIG. 5 in which a metal layer has been deposited on the dielectric layer.

In FIG. 7, the photoelectric device 100 has been further developed by depositing a reflective back metal layer 170 over the dielectric layer 162, providing one example of a textured layer 180. The metal layer 170 comprises a metal that reflects light efficiently. For example, in some embodiments the metal layer 170 can be comprised of gold, silver, copper, or other reflective metals, derivatives thereof, and/or combinations thereof. The deposition of the metal layer 170 provides an approximately flat surface opposite to the template layer 140, 150, or 155. In some embodiments, the layer 140, 150, or 155 has received etching prior to subsequent processing steps. In some embodiments, the metal layer 170 can have an average thickness in a range of about 70 nm to about 10 μm. The material of the metal layer 170 also is deposited into the apertures 164 so that a conductive contact is made between the metal layer 170 and the semiconductor contact layer 160, or between the metal layer 170 and the template layer 140, 150, or 155 if no contact layer 160 is present. In some other embodiments, the metal layer 170 can be deposited over the template layer 140, 150, or 155 without having a dielectric layer 162 and/or a semiconductor contact layer 160 deposited between the metal and template layers.

Figure 8:
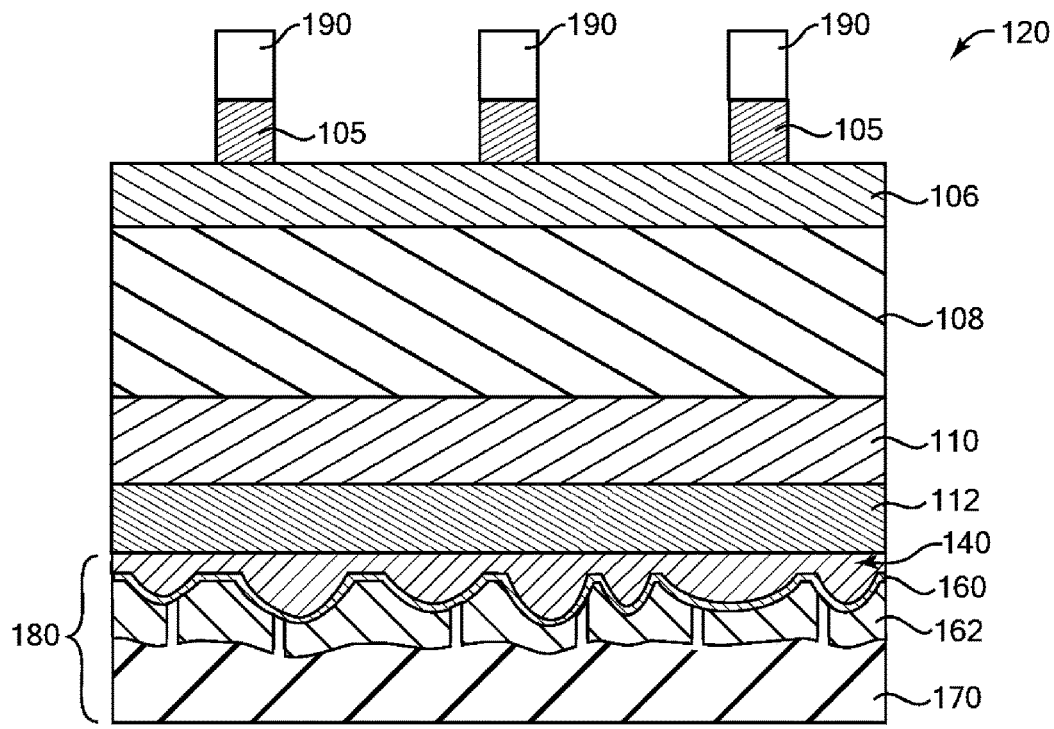
FIG. 8 depicts a cross-sectional view of one embodiment of a photovoltaic cell resulting from the photovoltaic device of FIG. 7 after a lift-off process.

In FIG. 8, the photovoltaic cell 120 is shown flipped over in orientation after a lift-off process has removed some of the layers shown in previous steps in FIGS. 2-7. Once the epitaxial layers have been formed for the PV device 100 as shown in FIG. 7, some layers of the photovoltaic device 100, such as the front contact layer 105, window layer 106, absorber layer 108, emitter layer 110, and textured layer 180 can be separated from substrate 101 and any buffer layer(s) 102 during an ELO process.

In one example, the photovoltaic device 100 may be exposed to an etchant solution in order to etch the sacrificial layer 104 and to separate the cell 120 from the growth wafer 101 during an epitaxial lift off (ELO) process. FIG. 8 shows the cell 120 in its resulting orientation, with the front of the cell 120 oriented at the top of the cell, where light impinges on and enters the cell. The textured layer 180 thus acts as a back reflector at a position further from the front of the cell 120 than the p-n junction formed by the absorber and emitter layers. Once separated, the cell 120 may be further processed to form a variety of photovoltaic devices, including photovoltaic cells and modules. For example, metal contacts 190 can be deposited on the front contact layer 105.

Figure 9:
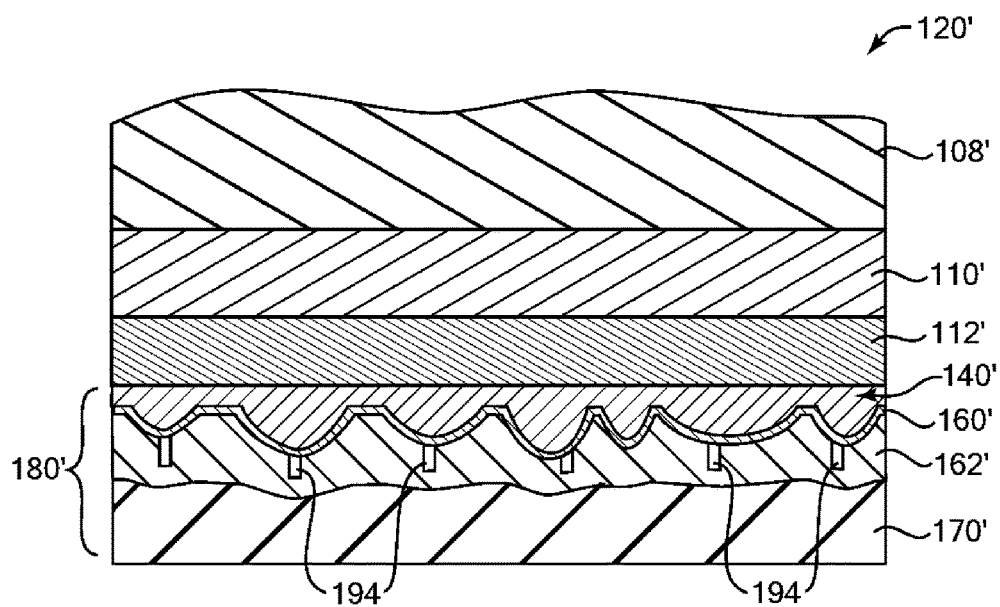
FIG. 9 depicts a cross-sectional view of another embodiment of a photovoltaic cell resulting from the photovoltaic device of FIG. 3A.

FIG. 9 illustrates a cross-sectional view of an alternate embodiment 120' of the photovoltaic cell 120 in which apertures are not formed in the dielectric layer 162, and conductive contacts are deposited under the dielectric layer 162. In this example, during layer deposition, a number of conductive contacts 194 can be deposited on the semiconductor contact layer 160', or on the template layer 140'/150'/155' if no contact layer 160' is present. In some embodiments, the layer 140', 150', or 155' has received etching prior to subsequent processing steps. A dielectric layer 162' is deposited over the contacts 194 and the semiconductor contact layer 160'. A metal contact layer 170' is deposited over the dielectric layer 160'. The device is then flipped over to the orientation shown in FIG. 9 after an ELO or similar process.

The conductive contacts 194 are shown in cross section, and can extend into or out of the plane of FIG. 9 to one or more locations (not shown) to be routed through the dielectric layer 162' to the metal contact layer 170'. For example, in some embodiments, the contacts 194 can be configured similarly to grooves 168 and 169 of the mask pattern 167 shown in FIG. 6B, where the contacts 194 extend over an area of the cell 120' and are connected to one or more connection nodes (e.g., similar to node 196 shown in FIG. 6B) that extend through the covering portion of the dielectric layer 162' to the metal contact layer 170', or extend to a location outside the cell 120'. Embodiments providing metal contacts 194 can avoid the etching of apertures in the dielectric layer, saving process steps in the formation of the cell 120'.

FIG. 10 shows a diagram illustrating a portion 200 of the photovoltaic cell 120 of FIG. 8, and in which light is received by the textured layer 180 acting as a back reflector layer. An active layer or region 202 is provided over a textured reflector layer 180. For example, the active layer 202 can be a solar cell active region such as an emitter layer 110 and/or absorber layer 108. One or more other layers 204 can also be positioned between the active layer 202 and the textured layer 180 in some embodiments.

Light 206 has traveled into the photovoltaic cell 120 and has not been absorbed by the upper layers. This light 206 emerges from the active layer 202 and impinges on the front surface 210 of the textured layer 180. The light 206 passes through the transparent material of the template layer 140, 150, or 155. In some embodiments, the layer 140, 150, or 155 has received etching prior to subsequent processing steps. Some of the photons 206 may hit a surface of the dielectric layer 162 and are reflected from that layer. Other photons 206 may pass through the dielectric layer 162 and may hit a surface of the back metal layer 170 and are reflected from that layer. The reflected photons are directed back through the template layer 140, 150, or 155 and then into the active layer 202 as indicated by arrows 212, where they can "bounce around" and may be captured by the absorber layer 108 and emitter layer 110 and further generate current in the cell.

The islands 144 of the template layer 140 (or islands 152 of template layer 150, or islands 156 of template layer 155) create recesses 172 in the dielectric layer 162 and the back metal layer 170. This creates a randomized, roughened, and angled front surface of the dielectric layer 162 and the back metal layer 170. The textured layer 180 diffuses or scatters photons that pass through the active layer 202 without being absorbed. The texturing of the textured layer 180 can provide new angles to incident photons, some of which may be redirected back through the template layer 140, 150, or 155 and towards the interior of the photovoltaic cell. Although some of the light may be absorbed by the template layer as the photons are scattered and redirected inside, much of the light is redirected to the active layer 202. The different angles on the surfaces of the textured layer 180 and its recesses 172 thus effectively cause the photons 206 to reflect at random angles back into the active layer 202 to allow a greater amount of them to be recaptured by the active layer and converted into electrical energy, thereby increasing the light trapping properties of the cell 120 and increasing efficiency.

Figure 11:
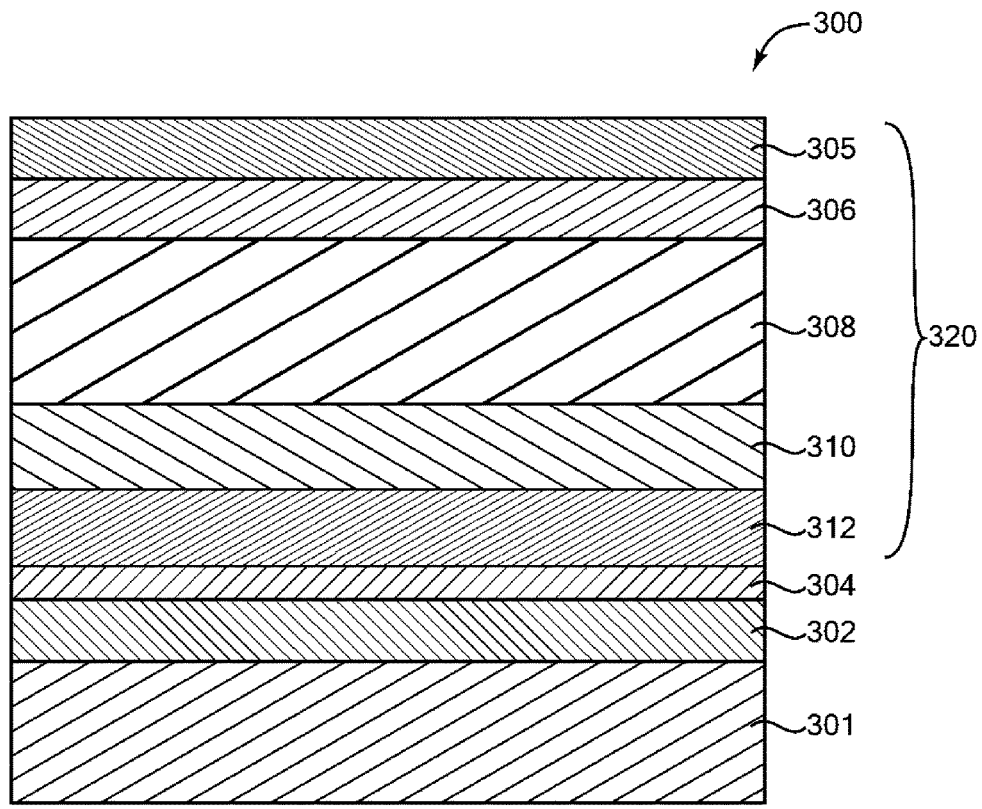
FIG. 11 depicts a cross-sectional view of a photovoltaic device in accordance with some embodiments described herein providing a front side light trapping textured layer.

FIG. 11 is a cross-sectional view of another embodiment of a photovoltaic device 300 suitable for providing a textured layer at a front side of the device. A textured layer can be provided for light trapping at the front side of a photovoltaic cell instead of, or in addition to, the back-side light trapping described above. This allows light impinging on the front side of the photovoltaic device to become scattered in the device by a textured surface created by the textured layer, increasing light trapping in the device.

Photovoltaic device 300 includes a cell 320 coupled with a growth wafer 301 by an ELO release layer or sacrificial layer 304 disposed therebetween. In some embodiments, one or more buffer layers 302 may be formed on the growth wafer 301 in order to start forming the photovoltaic device 300. Layers of the photovoltaic cell 320 can be deposited over the sacrificial layer 304, which in some embodiments can include a back semiconductor contact layer 312, an emitter layer 310 over the back contact layer 312, an absorber layer 308 over the emitter layer 310 (or emitter layer 310 over the absorber layer 308), a front window or passivation layer 306 over the absorber layer 308, and a base layer 305 for texturing, provided over the window layer 306.

In some embodiments, the back contact layer 312 can be comprised of a non-metal Group III-V compound semiconductor, such as gallium arsenide.

Figure 1C:
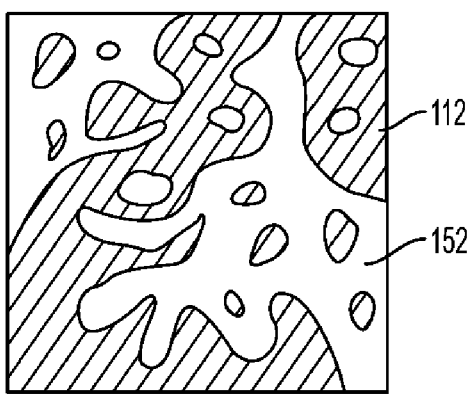

Base layer 305 for texturing is similar to base layer 112 described above with reference to FIG. 1. For example, the base layer 305 provides a first layer on which a template layer is deposited for texturing purposes, and may contribute to island formation for example by having a different composition (e.g., different lattice parameter) than the template layer.

In other embodiments, the device 300 is not grown on a sacrificial or ELO release layer structure as shown. For example, in other embodiments the device 300 is not included an ELO lift-off procedure and is grown on a substrate without the sacrificial layer 104 or buffer layers 302.

Figure 12:
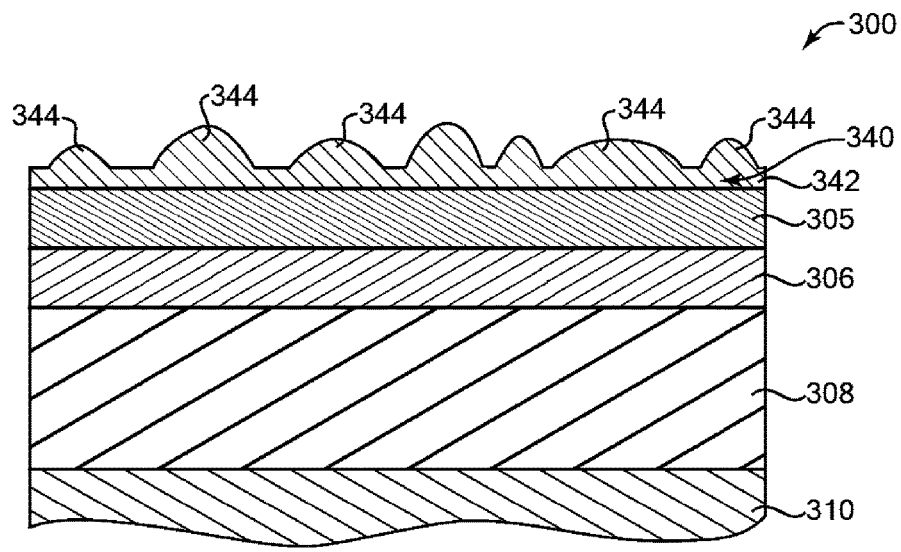
FIG. 12 depicts a cross-sectional view of the photovoltaic device of FIG. 11 in which an island layer has been deposited over a base layer.

FIG. 12 is a cross-sectional view of the photovoltaic device 300 including a deposition of a template layer 340 on the base layer 305 according to one embodiment of a textured layer for use as a front side light trapping layer. The template layer 340 may be created using an island-growth process and provide islands 344 for texturing one or more surfaces of the template layer to cause light reflection and scattering in the device, increasing light trapping. Some embodiments may include a wetting layer 342, similar to what is described above. In other embodiments there is no island growth in layer 340 but rather this template layer has compositional inhomogeneity and a subsequent etch process removes some material more quickly than other material. This is also similar to what is described above for FIG. 3C. In some embodiments, the layer 340 has received etching prior to subsequent processing steps.

Figure 13:
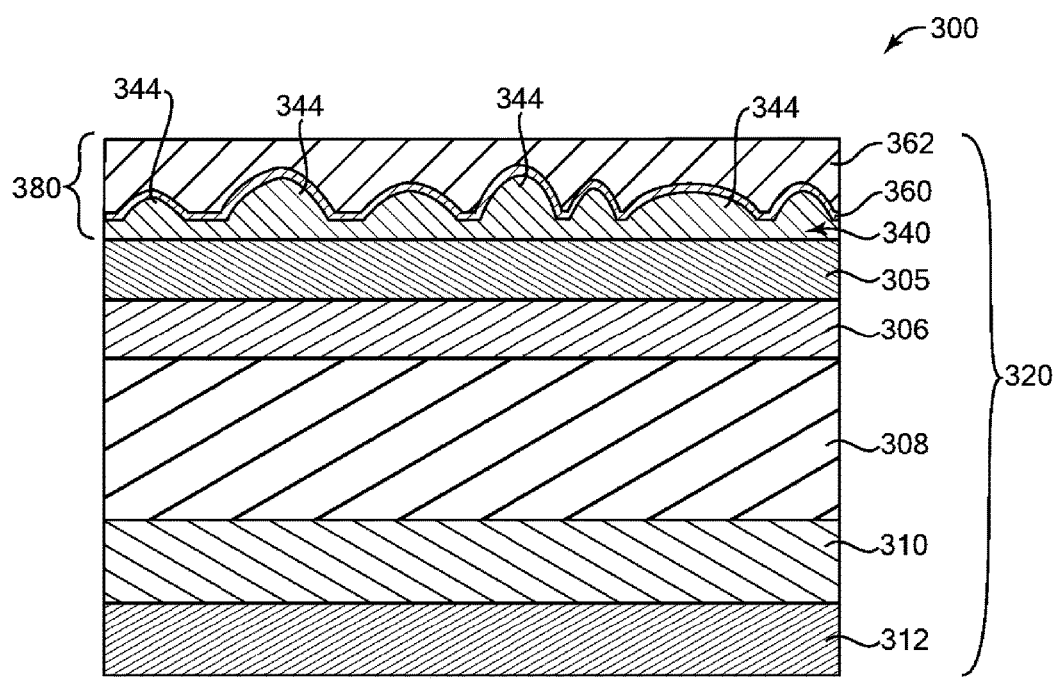
FIG. 13 depicts a cross-sectional view of the photovoltaic device of FIG. 12 in which layers have been deposited over the island layer.

In FIG. 13, the photoelectric device 300 has been further developed by depositing layers over the template layer 340. In some embodiments, as in the example shown in FIG. 13, an optional semiconductor contact layer 360 is deposited over the template layer 340.

An anti-reflective coating (ARC) 362 can be deposited over the semiconductor contact layer (if present) or over the template layer 340 (if contact layer 360 is not present). The ARC layer 362 comprises a dielectric material that allows light to pass through while preventing light reflection from the surface of the ARC layer 362. In some embodiments, the ARC layer 362 can comprise multiple layers.

In ELO embodiments, the cell 320 (including layers 340, 360, and 362) can be removed from the ELO layers 301, 302, and 304 using an ELO process. After removal, the cell 320 retains its orientation shown in FIGS. 11-13 and is not flipped over in orientation as for the back side reflector embodiment described above. In other embodiments, no ELO process is used for the cell 320.

The layers 340, 360, and 362 provide a front side light-trapping textured layer 380. The front side location of the textured layer 380 allows it to receive light impinging on the device 300 and scatter the light at different angles into the lower layers of the device 300 due to the textured, randomized surfaces of the islands in the template layer 340. This promotes light trapping as the photons bounce within the lower layers, allowing more of them to be absorbed to generate current.

In other embodiments of devices 100 and 300, other layer arrangements, doping arrangements, layer thickness, etc. can be used. For example, the emitter layer can be deposited over the absorber layer in some embodiments.

Embodiments of optoelectronic devices and methods to provide such devices described herein can provide a textured layer including islands created for a textured surface allowing increased light trapping. Disclosed embodiments also can provide advantages over previous light trapping layer formation techniques, including greater flexibility, reduced cost, and increased layer growth rate, saving time and expense in the manufacture of devices.

Although inventions have been described in accordance with the embodiments shown, one of ordinary skill in the art will readily recognize that there could be variations to the embodiments and those variations would be within the spirit and scope of the inventions. Accordingly, many modifications may be made by one of ordinary skill in the art without departing from the spirit and scope of the appended claims.

What is claimed is:

1. A method for providing a textured layer in an optoelectronic device, the method comprising:
   epitaxially growing a template layer of islands on a planar semiconductor layer wherein the template layer has significant inhomogeneity in thickness; and
   exposing the template layer and the planar semiconductor layer to an etching process, to create at least one textured surface in the planar semiconductor layer using the template layer as an etching mask.

2. The method of claim 1, wherein the at least one textured surface is operative to cause scattering of light.

3. The method of claim 1, wherein the template layer is formed by physical vapor deposition, chemical vapor deposition, liquid phase deposition, lithography, or liquid coating.

4. The method of claim 1, wherein the etching process is done by a liquid or solution-based chemical etchant.

5. The method of claim 1, wherein etching process is done by a technique from the group consisting of gas etching, laser etching, plasma etching, or ion etching.

6. The method of claim 1, wherein the template layer itself is not etched.

7. The method of claim 1, wherein the template layer itself is etched.

8. The method of claim 1, wherein the etching process is selective to etch the planar semiconductor layer more rapidly than the template layer.

9. The method of claim 1, wherein the etching process is selective to etch certain material compositions contained within the template layer more rapidly than certain other material compositions within the template layer.

10. The method of claim 1, wherein the template layer is formed due to a lattice mismatch between the template layer and the planar semiconductor layer, on which the template layer is epitaxially grown.

11. The method of claim 1, wherein the template layer is thin enough to incompletely cover the planar semiconductor layer on which it is epitaxially grown.

12. The method of claim 1, wherein the template layer includes a plurality of islands.

13. The method of claim 12, wherein the plurality of islands have variable dimensions relative to each other.

14. The method of claim 1, wherein the at least one textured surface causes photons to scatter at randomized angles.

15. The method of claim 1, wherein the template layer is a semiconductor and includes at least one of the group consisting of: gallium, aluminum, indium, phosphorus, nitrogen, and arsenic.

16. The method of claim 1, wherein the template layer has a larger band gap than the planar semiconductor layer.

17. The method of claim 1, wherein the template layer is transparent.

18. The method of claim 1, wherein the template layer is formed using a Stranski-Krastanov process.

19. The method of claim 1, wherein the template layer is formed using a Volmer-Weber process.

20. The method of claim 1, further comprising depositing a dielectric layer over the template layer.

21. The method of claim 1, further comprising depositing a transparent conducting oxide (TCO) layer over the template layer.

22. The method of claim 1, further comprising depositing an anti-reflective coating on the at least one textured surface.

23. The method of claim 1, further comprising depositing a metal reflective layer over the template layer.

24. The method of claim 23, wherein a dielectric layer between the metal reflective layer and the planar semiconductor layer is provided with apertures allowing a conductive contact between the metal reflective layer and the planar semiconductor layer or the template layer, or both.

25. The method of claim 1, wherein the at least one textured surface is a back reflector layer positioned further from the front of the optoelectronic device than a p-n junction of the optoelectronic device.

26. The method of claim 1, wherein the at least one textured surface is a front window layer positioned closer to the front of the optoelectronic device than a p-n junction of the optoelectronic device.

27. The method of claim 1 further comprising: depositing a semiconductor contact layer over the template layer; and depositing a dielectric layer over the semiconductor contact layer.

28. A textured surface in a photovoltaic device, the textured surface fabricated using the method of claim 1, the textured surface including the at least one textured surface.

29. A method for providing an optoelectronic device, the method comprising:
   depositing an emitter layer and an absorber layer;
   depositing a first planar layer of a first material over the emitter layer and the absorber layer;
   epitaxially growing a template layer of a second material on the first planar layer wherein the template layer has significant inhomogeneity in thickness;
   exposing the template layer and the first planar layer to an etching process to create at least one textured surface in the first planar layer using the template layer as an etching mask, wherein the at least one textured surface is operative to cause scattering of light;
   depositing a dielectric layer over the template layer; and
   depositing a metal layer over the dielectric layer.

30. A method for providing an optoelectronic device, the method comprising:
   depositing an emitter layer and an absorber layer;
   depositing a first planar layer of a first material over the emitter layer and the absorber layer;
   epitaxially growing a template layer of a second material on the first planar layer, the template layer having one or more islands of the second material;
   exposing the template layer and the first planar layer to an etching process to create at least one textured surface in the first planar layer, wherein at least one textured surface is operative to cause scattering of light; and
   then depositing an anti-reflective layer over the template layer.

* * * * *